(12) United States Patent
Jeong et al.

(10) Patent No.: US 12,382,716 B2
(45) Date of Patent: Aug. 5, 2025

(54) INTEGRATED CIRCUIT DEVICE

(71) Applicant: Samsung Electronics Co., Ltd., Suwon-si (KR)

(72) Inventors: Seojin Jeong, Suwon-si (KR); Jungtaek Kim, Suwon-si (KR); Moonseung Yang, Suwon-si (KR); Sumin Yu, Suwon-si (KR); Edward Namkyu Cho, Suwon-si (KR); Seokhoon Kim, Suwon-si (KR); Pankwi Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 399 days.

(21) Appl. No.: 18/185,941

(22) Filed: Mar. 17, 2023

(65) Prior Publication Data
US 2023/0402459 A1 Dec. 14, 2023

(30) Foreign Application Priority Data
Jun. 8, 2022 (KR) ........................ 10-2022-0069701

(51) Int. Cl.
*H01L 27/092* (2006.01)
*H01L 29/06* (2006.01)
(Continued)

(52) U.S. Cl.
CPC ........... *H10D 84/853* (2025.01); *H10D 30/43* (2025.01); *H10D 30/6211* (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 7,935,593 B2 5/2011 Yang et al.
11,257,928 B2 2/2022 Hsu et al.
(Continued)

FOREIGN PATENT DOCUMENTS

CN 114597252 6/2022
CN 114597253 6/2022

OTHER PUBLICATIONS

Extended European Search Report in European Appln. No. 23170622.7, mailed on Oct. 27, 2023, 13 pages.

*Primary Examiner* — David C Spalla
(74) *Attorney, Agent, or Firm* — Fish & Richardson P.C.

(57) ABSTRACT

An integrated circuit (IC) device includes a fin-type active region, a channel region on the fin-type active region, a gate line surrounding the channel region on the fin-type active region, a source/drain region that is adjacent to the gate line on the fin-type active region and has a sidewall facing the channel region, wherein the source/drain region includes a first buffer layer, a second buffer layer, and a main body layer, which are sequentially stacked in a direction away from the fin-type active region, each include a $Si_{1-x}Ge_x$ layer (x≠0) doped with a p-type dopant, and have different Ge concentrations, and the second buffer layer conformally covers a surface of the first buffer layer that faces the main body layer. A thickness ratio of the side buffer portion to the bottom buffer portion is in a range of about 0.9 to about 1.1.

22 Claims, 28 Drawing Sheets

(51) Int. Cl.
*H01L 29/423* (2006.01)
*H01L 29/775* (2006.01)
*H01L 29/78* (2006.01)
*H01L 29/786* (2006.01)
*H10D 30/43* (2025.01)
*H10D 30/62* (2025.01)
*H10D 30/67* (2025.01)
*H10D 62/10* (2025.01)
*H10D 84/85* (2025.01)

(52) U.S. Cl.
CPC ..... *H10D 30/6735* (2025.01); *H10D 30/6757* (2025.01); *H10D 62/121* (2025.01)

(58) Field of Classification Search
CPC ........... H10D 30/6212; H10D 30/6213; H10D 30/6735; H10D 30/6757; H10D 30/797; H10D 62/118; H10D 62/119; H10D 62/121; H10D 62/822; H10D 62/823; H10D 84/0158; H10D 84/0193; H10D 84/038; H10D 84/834; H10D 84/853
See application file for complete search history.

(56) References Cited

U.S. PATENT DOCUMENTS

| | | | |
|---|---|---|---|
| 12,080,759 B2 * | 9/2024 | Lin | H10D 30/031 |
| 12,094,938 B2 * | 9/2024 | Huang | H10D 64/01 |
| 2018/0138269 A1 * | 5/2018 | Kim | H10D 62/021 |
| 2021/0217860 A1 | 7/2021 | Ha et al. | |
| 2022/0069134 A1 | 3/2022 | Kim et al. | |
| 2022/0181459 A1 | 6/2022 | Cho et al. | |
| 2022/0181498 A1 | 6/2022 | Kim et al. | |
| 2022/0336614 A1 * | 10/2022 | Wang | H10D 64/017 |
| 2023/0378300 A1 * | 11/2023 | Chen | H10D 62/121 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0069701, filed on Jun. 8, 2022, in the Korean Intellectual Property Office, the disclosure of which is incorporated by reference herein in its entirety.

BACKGROUND

In recent years, as the downscaling of IC devices has rapidly progressed, it has become necessary to ensure not only a high operating speed but also high operating accuracy in IC devices. In addition, as the integration density of IC devices has increased and the sizes of IC devices have been reduced, it has become necessary to develop new structures capable of improving the performance and reliability of field-effect transistors (FETs) having fin-type active regions.

SUMMARY

The present disclosure relates to an integrated circuit (IC) device, and more particularly, to an IC device including a fin field-effect transistor (FinFET).

The subject matter of the present disclosure provides an integrated circuit (IC) device having a structure capable of improving the performance of a field-effect transistor (FET) having a fin-type active region and improving the reliability of an IC device including the FET.

According to an aspect of the subject matter of the present disclosure, there is provided an IC device including a fin-type active region extending along a first lateral direction on a substrate, a channel region on the fin-type active region, a gate line surrounding the channel region on the fin-type active region, the gate line extending along a second lateral direction, wherein the second lateral direction intersects with the first lateral direction, and a source/drain region adjacent to the gate line on the fin-type active region, the source/drain region having a sidewall facing the channel region, wherein the source/drain region includes a first buffer layer, a second buffer layer, and a main body layer, which are sequentially stacked in a direction away from the fin-type active region, the first buffer layer, the second buffer layer, and the main body layer each including a $Si_{1-x}Ge_x$ layer (here, x≠0) doped with a p-type dopant and having different germanium (Ge) concentrations from each other, the second buffer layer is between the first buffer layer and the main body layer to conformally cover a surface of the first buffer layer that faces the main body layer, and the second buffer layer includes a side buffer portion facing the channel region and a bottom buffer portion facing the fin-type active region, and a ratio of a thickness of the side buffer portion to a thickness of the bottom buffer portion is in a range of about 0.9 to about 1.1.

According to another aspect of the subject matter of the present disclosure, there is provided an IC device including a fin-type active region extending along a first lateral direction on a substrate, a nanosheet stack including a plurality of nanosheets, the plurality of nanosheets being apart from a fin top surface of the fin-type active region at different vertical distances and facing the fin top surface thereof in a vertical direction, a gate line surrounding the plurality of nanosheets on the fin-type active region, the gate line extending along a second lateral direction that is perpendicular to the first lateral direction, a pair of source/drain regions on both sides of the gate line on the fin-type active region, the pair of source/drain regions each being in contact with the plurality of nanosheets, wherein each of the pair of source/drain regions includes a first buffer layer, a second buffer layer, and a main body layer, which are sequentially stacked in a direction away from the fin-type active region, wherein the first buffer layer, the second buffer layer, and the main body layer each include a $Si_{1-x}Ge_x$ layer (here, x≠0) doped with a p-type dopant and have different germanium (Ge) concentrations from each other, the second buffer layer is between the first buffer layer and the main body layer to conformally cover a surface of the first buffer layer, which faces the main body layer, and the second buffer layer includes a side buffer portion facing the channel region and a bottom buffer portion facing the fin-type active region, and a ratio of a thickness of the side buffer portion to a thickness of the bottom buffer portion is in a range of about 0.9 to about 1.1.

According to another aspect of the subject matter of the present disclosure, there is provided an IC device including a fin-type active region extending along a first lateral direction on a substrate, a nanosheet stack including a plurality of nanosheets, the plurality of nanosheets being apart from a fin top surface of the fin-type active region at different vertical distances and facing the fin top surface thereof in a vertical direction, a gate line surrounding the plurality of nanosheets on the fin-type active region, the gate line extending along a second lateral direction, wherein the second lateral direction is perpendicular to the first lateral direction, a source/drain region on one side of the gate line on the fin-type active region, the source/drain region being in contact with the plurality of nanosheets, wherein the source/drain region includes a first buffer layer, a second buffer layer, and a main body layer, which are sequentially stacked in a direction away from the fin-type active region, wherein the first buffer layer, the second buffer layer, and the main body layer each include a $Si_{1-x}Ge_x$ layer (here, x≠0) doped with boron (B) and have gradually increased Ge concentrations and gradually increased concentrations of boron in a direction away from the fin-type active region in the vertical direction, the second buffer layer is between the first buffer layer and the main body layer to conformally cover a surface of the first buffer layer, which covers the main body layer, and the second buffer layer includes a side buffer portion facing the plurality of nanosheets and a bottom buffer portion facing the fin-type active region, and a ratio of a thickness of the side buffer portion to a thickness of the bottom buffer portion is in a range of about 0.9 to about 1.1.

Advantages of the subject matter disclosed herein can include forming a source/drain region such that a buffer layer is between layers of high and low concentrations of Ge, B, or both Ge and B, which can reduce a resistance of the source/drain region. The buffer layer can have a conformal profile, which can allow uniform coverage of the layer having low concentrations of Ge, B, or both Ge and B.

In some implementations, the concentration of Ge can sequentially increase from a first SiGe layer, to the buffer layer, to a SiGe second layer. The second SiGe layer can be formed in an upper portion of the source/drain region, which can suppress the local segregation of B. In some implementations, the conformal profile of the buffer layer can reduce growth defects in epitaxial growth of the layers compared to implementations without a buffer layer. In some implementations, a reduced resistance of the source/drain region can improve the electrical performance of the integrated circuit device.

BRIEF DESCRIPTION OF THE DRAWINGS

Embodiments of the subject matter of the present disclosure will be more clearly understood from the following detailed description taken in conjunction with the accompanying drawings in which.

DETAILED DESCRIPTION

Figure 1:
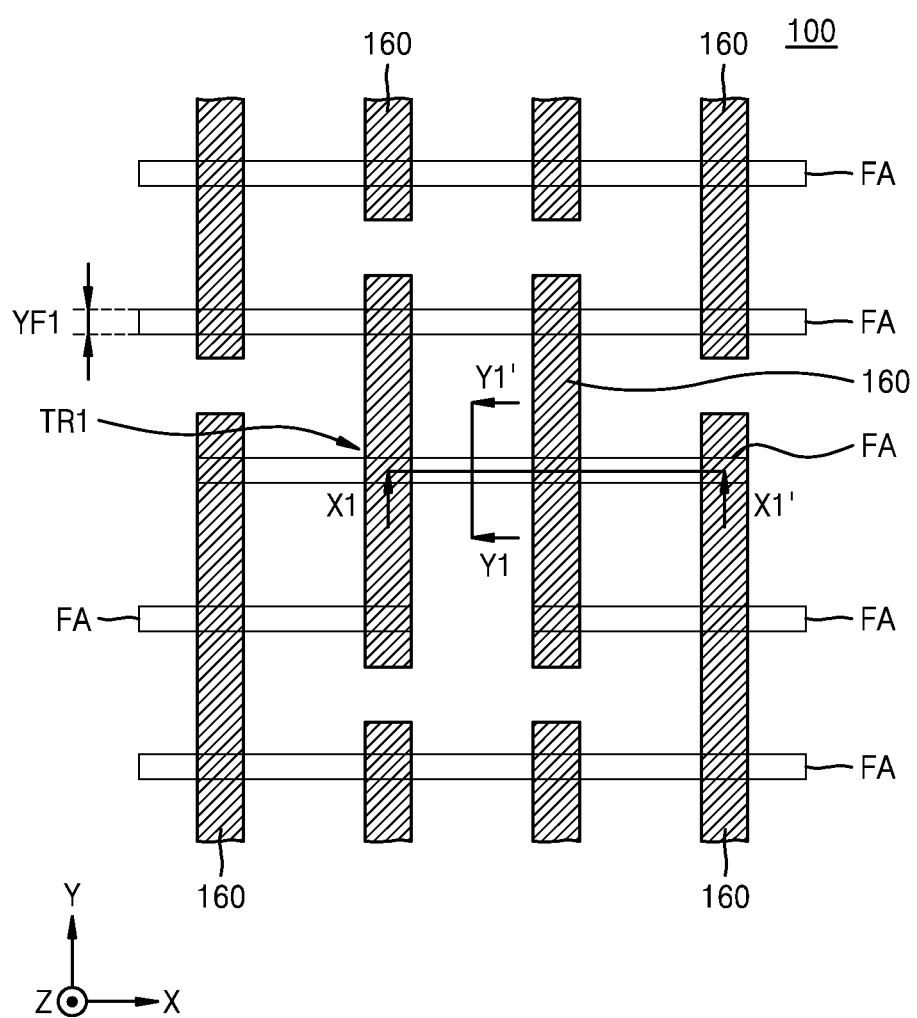
FIG. 1 is a plan layout diagram of some components of an example of an integrated circuit (IC) device.

Hereinafter, examples will be described in detail with reference to the accompanying drawings. The same reference numerals are used to denote the same elements in the drawings, and repeated descriptions thereof are omitted.

Figure 2A:
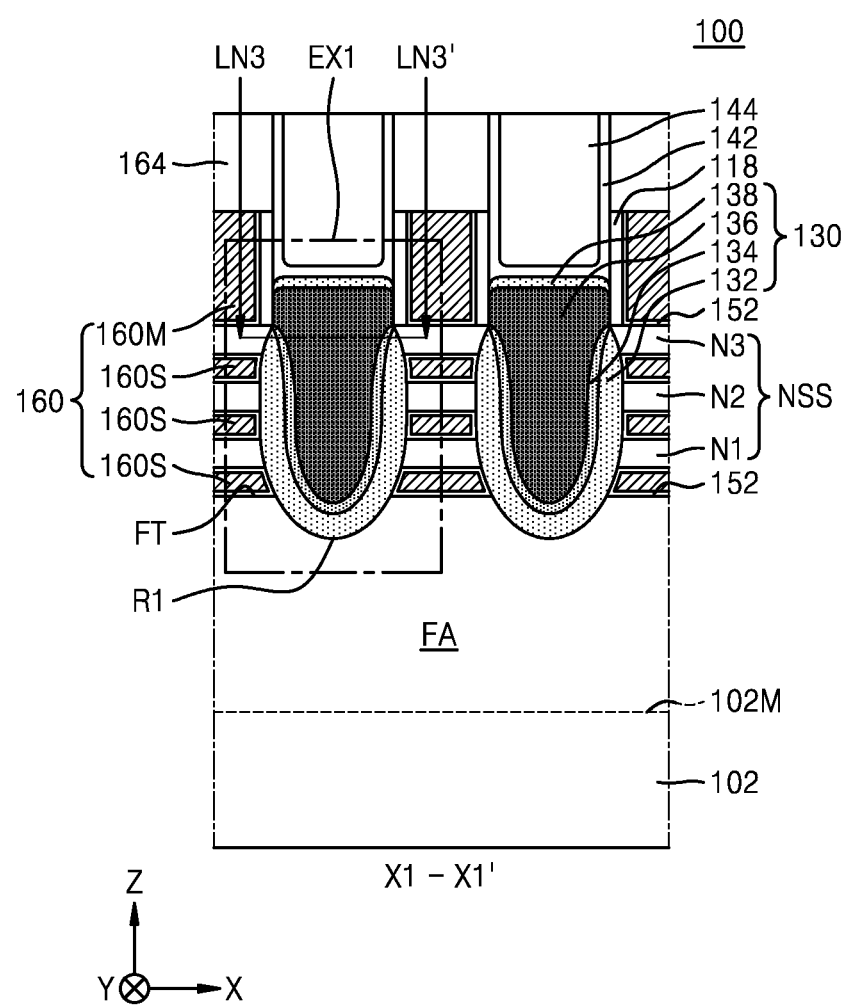
FIG. 2A is a cross-sectional view taken along line X1-X1' of FIG. 1.
Figure 2B:
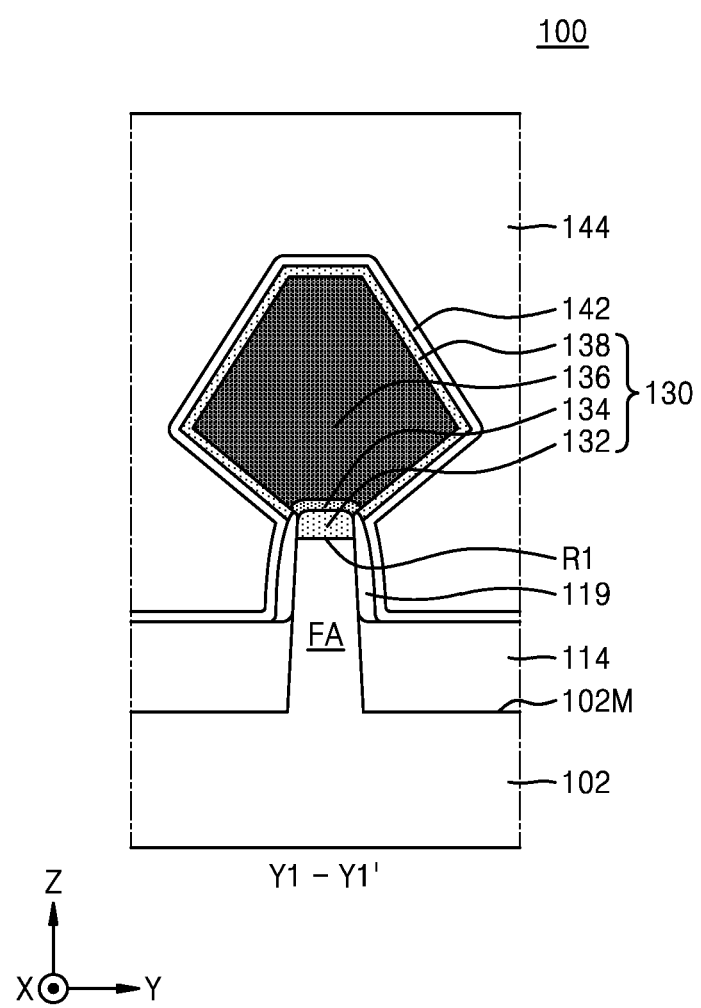
FIG. 2B is a cross-sectional view taken along line Y1-Y1' of FIG. 1.
Figure 2C:
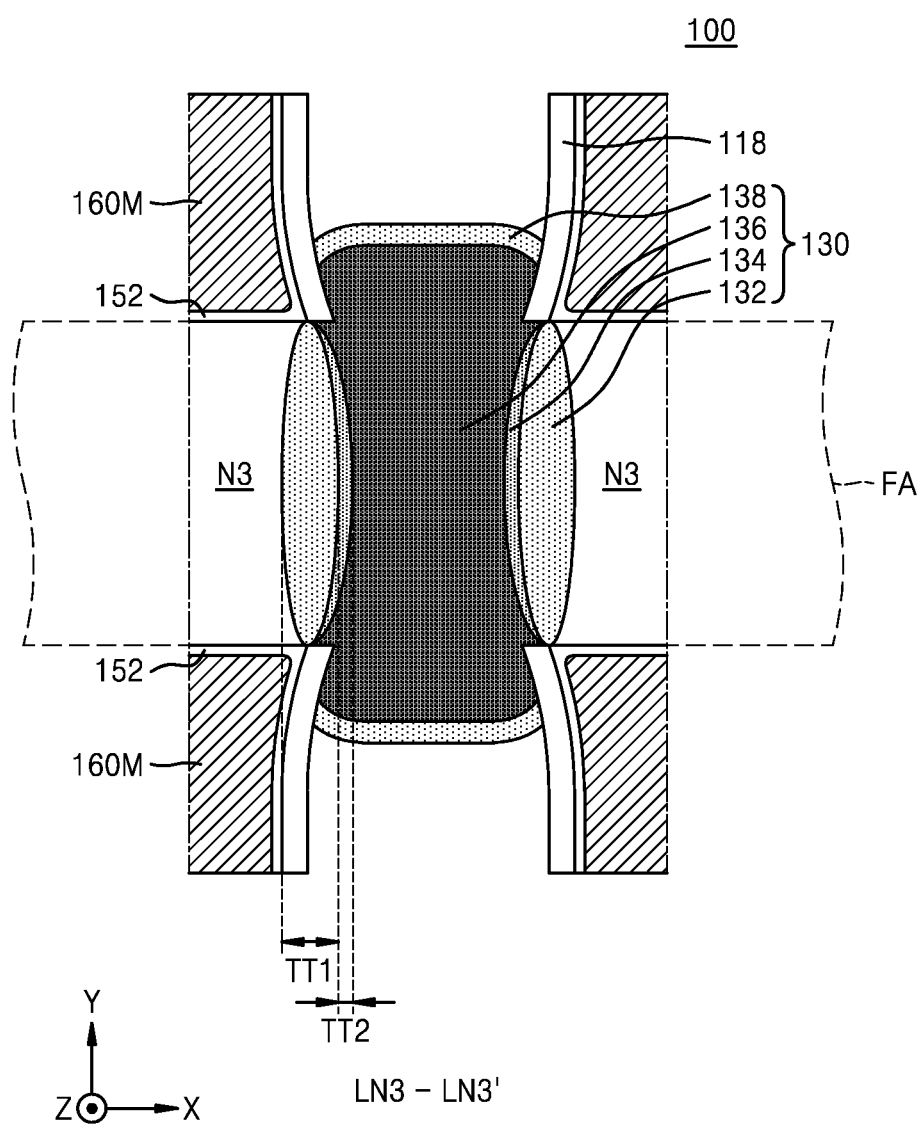
FIG. 2C is an enlarged plan view of some components taken along line LN3-LN3' of FIG. 2A, at a vertical level.
Figure 2D:
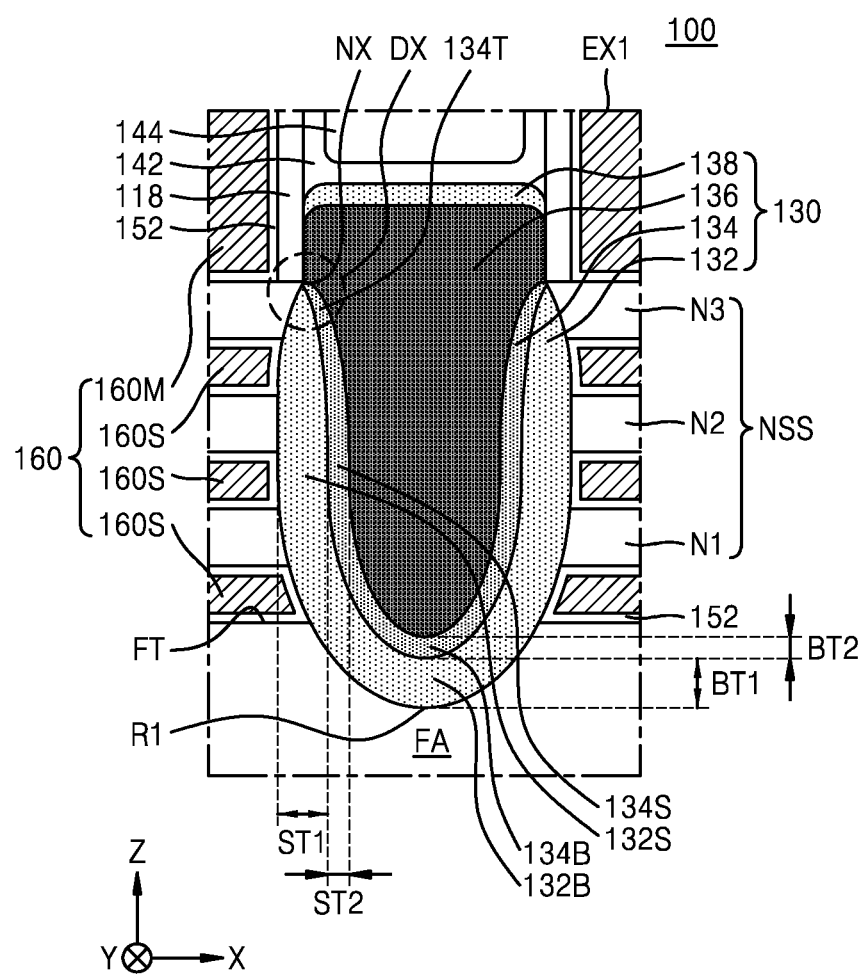
FIG. 2D is an enlarged cross-sectional view of a local region "EX1" of FIG. 2A.

FIG. 1 is a plan layout diagram of some components of an example of an integrated circuit (IC) device 100. FIG. 2A is a cross-sectional view taken along line X1-X1' of FIG. 1. FIG. 2B is a cross-sectional view taken along line Y1-Y1' of FIG. 1. FIG. 2C is an enlarged plan view of some components taken along line LN3-LN3' of FIG. 2A, at a vertical level. FIG. 2D is an enlarged cross-sectional view of a local region "EX1" of FIG. 2A. The IC device 100 including field-effect transistor (FETs) having a gate-all-around structure including an active region of a nanowire or nanosheet type and a gate surrounding the active region will now be described with reference to FIGS. 1 and 2A to 2D.

Referring to FIGS. 1 and 2A to 2D, the IC device 100 may include a plurality of fin-type active regions FA, which may protrude upward from a substrate 102 in a vertical direction (Z direction) and extend along a first lateral direction (X direction). A plurality of nanosheet stacks NSS may be on the plurality of fin-type active regions FA. Each of the plurality of nanosheet stacks NSS may include at least one nanosheet, which is apart from a fin top surface FT of the fin-type active region FA in the vertical direction (Z direction) and faces the fin top surface FT of the tin-type active region FA. As used herein, the term "nanosheet" refers to a conductive structure having a cross-section that is substantially perpendicular to a direction in which current flows. The nanosheet may be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

As shown in FIG. 2B, a device isolation film 114 covering both sidewalls of each of the plurality of fin-type active regions FA may be on the substrate 102. The device isolation film 114 may include an oxide film, a nitride film, or a combination thereof.

As shown in FIGS. 2A and 2D, a plurality of gate lines 160 may be on the plurality of fin-type active regions FA. Each of the plurality of gate lines 160 may extend in a second lateral direction (Y direction) on the fin-type active region FA and the device isolation film 114. The second lateral direction (Y direction) may be perpendicular to the first lateral direction (X direction). The plurality of nanosheet stacks NSS may be respectively on fin top surfaces FT of the plurality of fin-type active regions FA in portions where the plurality of fin-type active regions FA intersect with the plurality of gate lines 160. As shown in FIG. 1, a PMOS transistor TR1 may be formed at each of intersections between the plurality of fin-type active regions FA and the plurality of gate lines 160.

Each of the plurality of nanosheet stacks NSS may include a plurality of nano sheets (e.g., a first nanosheet N1, a second nanosheet N2, and a third nanosheet N3), which overlap each other in the vertical direction (Z direction) on the fin-type active region FA. The first nanosheet N1, the second nanosheet N2, and the third nanosheet N3 may be at different vertical distances (Z-directional distances) from the fin top surface FT of the fin-type active region FA. Each of the first to third nanosheets N1, N2, and N3 included in the nanosheet stack NSS may have a channel region. For example, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In some implementations, the first to third nanosheets N1, N2, and N3 may have substantially the same thickness in the vertical direction (Z direction). In some implementations, at least some of the first to third nanosheets N1, N2, and N3 may have different thicknesses in the vertical direction (Z direction).

In some implementations, at least some of the first to third nanosheets N1, N2, and N3 included in one nanosheet stack NSS may have different sizes in the first lateral direction (X direction). In some implementations, at least some of the first to third nanosheets N1, N2, and N3 may have the same size in the first lateral direction (X direction).

A plurality of recesses R1 may be formed in the fin-type active region FA. As shown in FIG. 2A, a lowermost surface of each of the plurality of recesses R1 may be at a lower vertical level than the fin top surface FT of the fin-type active region FA. As used herein, the term "vertical level" refers to a height from a main surface 102M of the substrate 102 in a vertical direction (Z direction or −Z direction).

A plurality of source/drain regions 130 may be respectively inside the plurality of recesses R1. Each of the plurality of source/drain regions 130 may be adjacent to at least one gate line 160 selected from the plurality of gate lines 160. Each of the plurality of source/drain regions 130 may have sidewalls facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

On the substrate 102, some of the plurality of fin-type active regions FA may be arranged at a constant pitch. Some other ones of the plurality of fin-type active regions FA may be formed at variable pitches, so a distance between two adjacent ones of the fin-type active regions FA may depend on a position.

Each of the plurality of source/drain regions 130 may include an epitaxially grown semiconductor layer. Each of the plurality of source/drain regions 130 may include a Group-IV compound semiconductor. At least a portion of each of the plurality of source/drain regions 130 may be doped with a p-type dopant. In some implementations, the p-type dopant may be selected from boron (B) and (Ga).

Each of the plurality of source/drain regions 130 may include a first buffer layer 132, a second buffer layer 134, a main body layer 136, and a capping layer 138, which are sequentially stacked in a direction away from the fin-type active region FA in the vertical direction (Z direction). The second buffer layer 134 may be between the first buffer layer 132 and the main body layer 136 to conformally cover a surface of the first buffer layer 132, which faces the main body layer 136. Each of the plurality of source/drain regions 130 may have a top surface that is at a higher vertical level than an uppermost surface of each of the plurality of nanosheet stacks NSS.

As shown in FIG. 2A, in a cross-sectional view taken in the first lateral direction (X direction), a thickness of the second buffer layer 134 may be less than a thickness of the first buffer layer 132 in the first lateral direction (X direction) from a sidewall of the nanosheet stack NSS. In addition, in the vertical direction (Z direction) from a lowermost surface of the source/drain region 130, the thickness of the second buffer layer 134 may be less than the thickness of the first buffer layer 132.

More specifically, as shown in FIG. 2D, the first buffer layer 132 may include a side buffer portion 132S and a bottom buffer portion 132B. The side buffer portion 132S may face each of the first to third nanosheets N1, N2, and N3 included in the nanosheet stack NSS in the first lateral direction (X direction). The bottom buffer portion 132B may face the fin-type active region FA in the vertical direction (Z direction). In the first buffer layer 132, a ratio of a thickness ST1 of the side buffer portion 132S to a thickness BT1 of the bottom buffer portion 132B may be in a range of about 0.9 to about 1.1.

As shown in FIG. 2D, the second buffer layer 134 may include a side buffer portion 134S and a bottom buffer portion 134B. The side buffer portion 134S may face each of the first to third nanosheets N1, N2, and N3 included in the nanosheet stack NSS in the first lateral direction (X direction). The bottom buffer portion 134B faces the fin-type active region FA in the vertical direction (Z direction). In the second buffer layer 134, a ratio of a thickness ST2 of the side buffer portion 134S to a thickness BT2 of the bottom buffer portion 134B may be in a range of about 0.9 to about 1.1.

As shown in FIG. 2D, the thickness ST2 of the side buffer portion 134S of the second buffer layer 134 may be less than the thickness ST1 of the side buffer portion 132S of the first buffer layer 132, and the thickness BT2 of the bottom buffer portion 134B of the second buffer layer 134 may be less than the thickness BT1 of the bottom buffer portion 132B of the first buffer layer 132.

In some implementations, in the first buffer layer 132, each of the thickness ST1 of the side buffer portion 132S and the thickness BT1 of the bottom buffer portion 132B may be selected in a range of about 3 nm to about 10 nm, a range of about 6 nm to about 9 nm, or a range of about 7 nm to about 8 nm. In the second buffer layer 134, each of the thickness ST2 of the side buffer portion 134S and the thickness BT2 of the bottom buffer portion 134B may be selected in a range of about 1 nm to about 5 nm, a range of about 1 nm to about 3 nm, or a range of about 1 nm to about 2 nm. For example, each of the thickness ST1 of the side buffer portion 132S and the thickness BT1 of the bottom buffer portion 132B may be about 8 nm in the first buffer layer 132, and each of the thickness ST2 of the side buffer portion 134S and the thickness BT2 of the bottom buffer portion 134B may be about 2 nm in the second buffer layer 134, without being limited thereto.

The first buffer layer 132, the second buffer layer 134, and the main body layer 136 may each include a $Si_{1-x}Ge_x$ layer (here, x≠0) doped with a p-type dopant and have different Ge concentrations from each other. In some implementations, the first buffer layer 132, the second buffer layer 134, and the main body layer 136 may each include a $Si_{1-x}Ge_x$ layer (here, x≠0) doped with a p-type dopant. A Ge concentration of the second buffer layer 134 may be higher than a Ge concentration of the first buffer layer 132 and lower than a Ge concentration of the main body layer 136. For example, each of the first buffer layer 132, the second buffer layer 134, and the main body layer 136 may include a $Si_{1-x}Ge_x$ layer (here, x≠0) doped with boron (B). The main body layer 136 may have gradually increased Ge concentrations and gradually increased concentrations of boron in a direction away from the fin-type active region FA in the vertical direction (Z direction).

The capping layer 138 may include an undoped Si layer, a Si layer doped with the p-type dopant, or a SiGe layer having a lower Ge concentration than the main body layer 136. In some implementations, the capping layer 138 may not include germanium (Ge). For example, the capping layer 138 may include an undoped Si layer. In some implementations, the capping layer 138 may include a Si layer doped with boron or a SiGe layer doped with boron. In some implementations, the capping layer 138 may be omitted.

In some implementations, the first buffer layer 132 may include a $Si_{1-x}Ge_x$ layer (here, 0.05≤x≤0.07) doped with boron, the second buffer layer 134 may include a $Si_{1-x}Ge_x$ layer (here, 0.40≤x≤0.45) doped with boron, and the main body layer 136 may include a $Si_{1-x}Ge_x$ layer (here, 0.45<x≤0.70) doped with boron, without being limited thereto. For example, a Ge concentration of the second buffer layer 134 may be in a range of about 40 atomic percent (at %) to about 45 at %, and a Ge concentration of the main body layer 136 may be more than about 45 at % and less than or equal to about 60 at %, without being limited thereto.

In some implementations, the concentration of a p-type dopant in the second buffer layer 134 may be higher than the concentration of the p-type dopant in the first buffer layer 132 and lower than the concentration of the p-type dopant in the main body layer 136. In some implementations, the p-type dopant may include boron in each of the first buffer layer 132, the second buffer layer 134, and the main body layer 136, and the concentration of boron in the second buffer layer 134 may be higher than the concentration of boron in the first buffer layer 132 and lower than the concentration of boron in the main body layer 136. In some implementations, a first difference between the concentration of boron in the second buffer layer 134 and the concentration of boron in the first buffer layer 132 may be greater than a second difference between the concentration of boron in the main body layer 136 and the concentration of boron in the second buffer layer 134. For example, the concentration of boron in the first buffer layer 132 may be about 2E18 atoms/cm$^3$ or higher and about 7E18 atoms/cm$^3$ or lower, the concentration of boron in the second buffer layer 134 may be about 1E20 atoms/cm$^3$ or higher and lower than about 5E20 atoms/cm$^3$, and the concentration of boron in the main body layer 136 may be about 5E20 atoms/cm$^3$ or higher and about 7E20 atoms/cm$^3$ or lower, without being limited thereto.

As shown in FIGS. 2A and 2D, in the source/drain region 130, the first buffer layer 132 may be in contact with each of the first to third nanosheets N1, N2, and N3 included in the nanosheet stack NSS. In the source/drain region 130, the second buffer layer 134 may be in contact with only the third nanosheet N3, which is an uppermost layer farthest from the substrate 102, from among the first to third nanosheets N1, N2, and N3 included in the nanosheet stack NSS.

As illustrated with a dashed circle DX in FIG. 2D, the second buffer layer 134 may include a top buffer portion 134T in contact with the third nanosheet N3. In the second buffer layer 134, a thickness of the top buffer portion 134T may be less than the thickness ST2 of the side buffer portion 134S and less than the thickness BT2 of the bottom buffer portion 134B. The top buffer portion 134T of the second buffer layer 134 may include a portion of which a thickness gradually reduces toward the third nanosheet N3.

As illustrated with the dashed circle DX in FIG. 2D, a contact portion NX of the third nanosheet N3, which is in contact with the second buffer layer 134, may be a portion adjacent to an uppermost surface of the third nanosheet N3. A vertical distance (a distance in a Z direction in FIG. 2D) between the contact portion NX of the third nanosheet N3 and the uppermost surface of the third nanosheet N3 may be less than a vertical distance between the contact portion NX of the third nanosheet N3 and a lowermost surface of the third nanosheet N3. In some implementations, the vertical distance between the contact portion NX of the third nanosheet N3 and the uppermost surface of the third nanosheet N3 may be in a range of about 0 nm to about 1 nm, without being limited thereto. In addition, the vertical distance of the contact portion NX may be more than about nm and less than or equal to about 2 nm, without being limited thereto.

In some implementations, in each of the plurality of nanosheet stacks NSS, the first nanosheet N1, the second nanosheet N2, and the third nanosheet N3 may include a semiconductor layer including the same element. In an example, each of the first nanosheet N1, the second nanosheet N2, and the third nanosheet N3 may include a Si layer. In some implementations, each of the first nanosheet N1, the second nanosheet N2, and the third nanosheet N3 may include a Si layer doped with a dopant of the same conductivity type as that of the source/drain region 130. In an example, each of the first nanosheet N1, the second nanosheet N2, and the third nanosheet N3 may include a Si layer doped with a p-type dopant. The p-type dopant may include B, Ga, or a combination thereof, without being limited thereto. In some implementations, each of the first nanosheet N1, the second nanosheet N2, and the third nanosheet N3 may include an undoped Si layer.

As shown in FIGS. 2A, 2C, and 2D, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively arranged between the first to third nanosheets N1, N2, and N3 and between the first nanosheet N1 and the fin-type active region FA. In the vertical direction (Z direction), a thickness of each of the plurality of sub-gate portions 160S may be less than a thickness of the main gate portion 160M.

Each of the gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In some implementations, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some implementations, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIG. 2A, a pair of source/drain regions 130 may be on both sides of the gate line 160 with one gate line 160 therebetween on the fin-type active region FA. The pair of source/drain regions 130 may be in contact with a sidewall adjacent thereto, from among both sidewalls of the nanosheet NSS surrounded by the one gate line 160.

Both sidewalls of each of the plurality of gate lines 160 may be covered by outer insulating spacers 118. The outer insulating spacers 118 may cover both sidewalls of the main gate portion 160M on the top surface of each of the plurality of nanosheet stacks NSS. The outer insulating spacer 118 may be apart from the gate line 160 with a gate dielectric film 152 therebetween.

As shown in FIGS. 2A and 2D, each of the plurality of source/drain regions 130 may include a portion that overlaps the outer insulating spacer 118 in the vertical direction (Z direction). For example, a portion of each of the plurality of source/drain regions 130, which overlaps the outer insulating spacer 118 in the vertical direction (Z direction), may have a width selected in a range of about 0 nm to about 4 nm in the first lateral direction (X direction). In some implementations, each of the plurality of source/drain regions 130 may not include a portion that overlaps the main gate portion 160M in the vertical direction (Z direction).

Both sidewalls of each of the plurality of sub-gate portions 160S may be apart from the source/drain region 130 with the gate dielectric film 152 therebetween. The gate dielectric film 152 may include a portion in contact with the first buffer layer 132 of the source/drain region 130.

As shown in FIG. 2B, the IC device 100 may include recess-side insulating spacers 119 covering both sidewalls of the fin-type active region FA between the device isolation film 114 and the source/drain region 130. The recess-side insulating spacers 119 may be in contact with a lower portion of the source/drain region 130. In some implementations, the recess-side insulating spacers 119 may be integrally connected to the outer insulating spacer 118 adjacent thereto.

Each of the outer insulating spacer 118 and the recess-side insulating spacer 119 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

As shown in FIG. 2C, the second buffer layer 134 may include a portion in contact with the outer insulating spacer 118. In FIG. 2C, a planar shape of the fin-type active region FA is illustrated with dashed lines to facilitate the understanding of relative positions and shapes of components of the IC device 100. As shown in FIG. 2C, in a view from an X-Y plane, a partial region of each of the first buffer layer 132 and the second buffer layer 134 may have a gradually reduced width toward the outer insulating spacer 118 in the first lateral direction (X direction). In a region apart from the outer insulating spacer 118, a thickness TT1 of the first buffer layer 132 covering the third nanosheet N3 may be greater than a thickness TT2 of the second buffer layer 134 covering the third nanosheet N3.

As shown in FIGS. 2A, 2B, and 2D, the source/drain region 130, the outer insulating spacer 118, and the recess-side insulating spacer 119 may be covered by an insulating liner 142. The insulating liner 142 may include silicon nitride (SiN), silicon oxide (SiO), SiCN, SiBN, SiON, SiOCN, SiBCN, SiOC, or a combination thereof. An inter-gate dielectric film 144 may be on the insulating liner 142. The inter-gate dielectric film 144 may include a silicon nitride film, a silicon oxide film, SiON, SiOCN, or a combination thereof. In some implementations, the insulating liner 142 may be omitted.

In the IC device 100 described with reference to FIGS. 1 and 2A to 2D, the PMOS transistor TR1 may include the source/drain region 130, and the source/drain region 130 may include the first buffer layer 132, the second buffer layer 134, and the main body layer 136, which are sequentially stacked in a direction away from the fin-type active region FA in the vertical direction (Z direction). The second buffer layer 134 may be between the first buffer layer 132 and the main body layer 136 to conformally cover a surface of the first buffer layer 132, which faces the main body layer 136. Therefore, the performance of the PMOS transistor TR1 including the source/drain region 130 may be improved, and the reliability of the IC device 100 may be improved.

Figure 3:
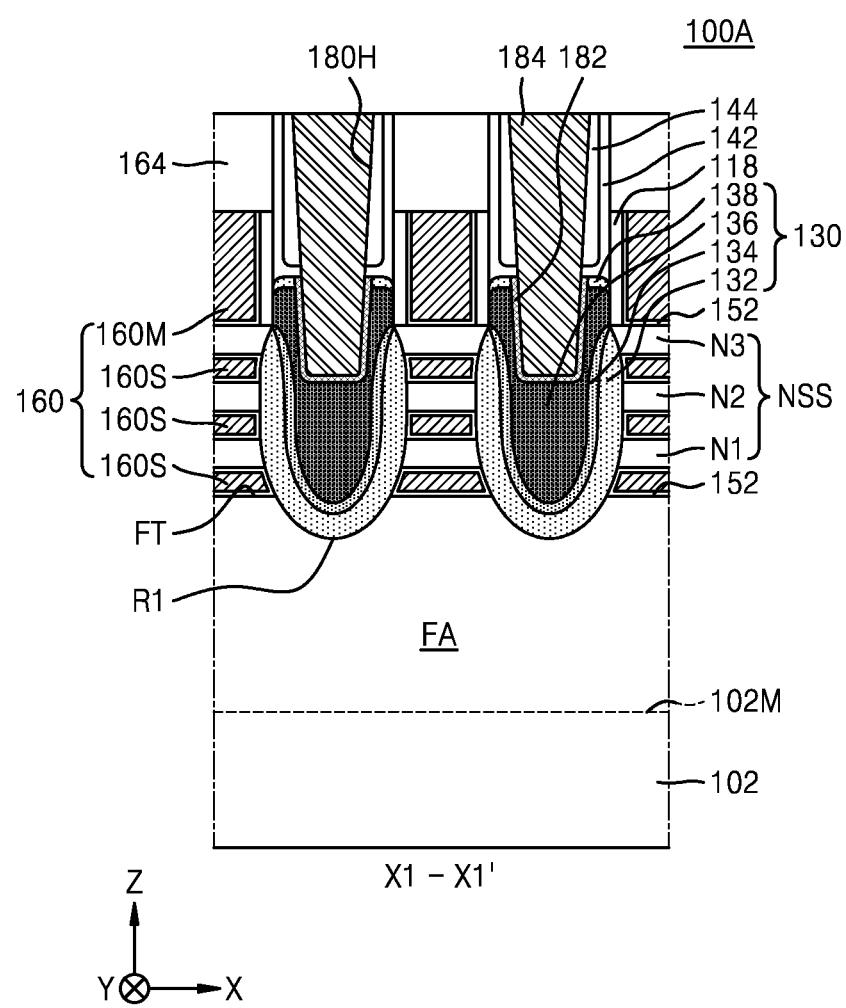
FIG. 3 is a cross-sectional view of an example of an IC device.

FIG. 3 is a cross-sectional view of an IC device 100A according to an example of an implementation. FIG. 3 illustrates some components in a portion corresponding to a cross-section taken along line X1-X1' of FIG. 1. In FIG. 3, the same reference numerals are used to denote the same elements as in FIGS. 1 and 2A to 2D, and detailed descriptions thereof are omitted.

Referring to FIG. 3, the IC device 100A may have substantially the same configuration as the IC device 100 described with reference to FIGS. 1 and 2A to 2D. However, the IC device 100A may further include a plurality of source/drain contacts 184 respectively on a plurality of source/drain regions 130. Each of the plurality of source/drain contacts 184 may extend along a vertical direction (Z direction) between a pair of gate lines 160, which are adjacent to each other, from among a plurality of gate lines 160. A metal silicide film 182 may be between the source/drain region 130 and the source/drain contact 184.

Each of the plurality of source/drain contacts 184 may fill a contact hole 180H, which passes through an inter-gate dielectric film 144 and an insulating liner 142 in the vertical direction (Z direction) and extends into the source/drain region 130. The source/drain region 130 may be apart from the source/drain contact 184 with the metal silicide film 182 therebetween. The source/drain region 130 may surround a lower portion of the source/drain contact 184 outside the contact hole 180H.

In some implementations, the metal silicide film 182 may include titanium silicide, without being limited thereto. In some implementations, the metal silicide film 182 may be omitted. In some implementations, each of the plurality of source/drain contacts 184 may include a metal, a conductive metal nitride, or a combination thereof. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof.

Figure 4:
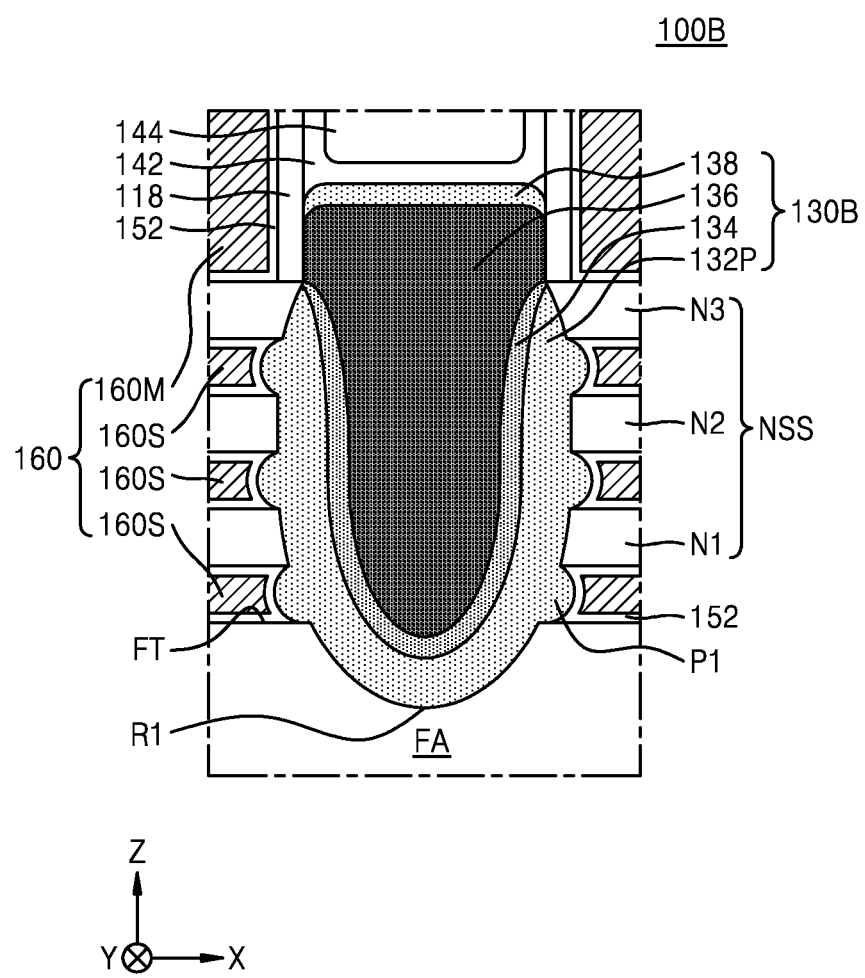
FIG. 4 is a cross-sectional view of an example of an IC device.

FIG. 4 is a cross-sectional view of an example of an IC device 100B. FIG. 4 illustrates an enlarged cross-sectional configuration of a region corresponding to the local region "EX1" of FIG. 2A in the IC device 100B.

Referring to FIG. 4, the IC device 100B may have substantially the same configuration as the IC device 100 described with reference to FIGS. 1 and 2A to 2D. However, the IC device 100B may include a source/drain region 130B, which fills a recess R1 in a fin-type active region FA.

The source/drain region 130B may have substantially the same configuration as the source/drain region 130 described with reference to FIGS. 2A to 2D. However, the source/drain region 130B may include a first buffer layer 132P having a plurality of protrusions P1, which protrude toward a plurality of sub-gate portions 160S. A detailed configuration of the first buffer layer 132P may be the same as that of the first buffer layer 132 described with reference to FIGS. 2A to 2D.

Figure 5:
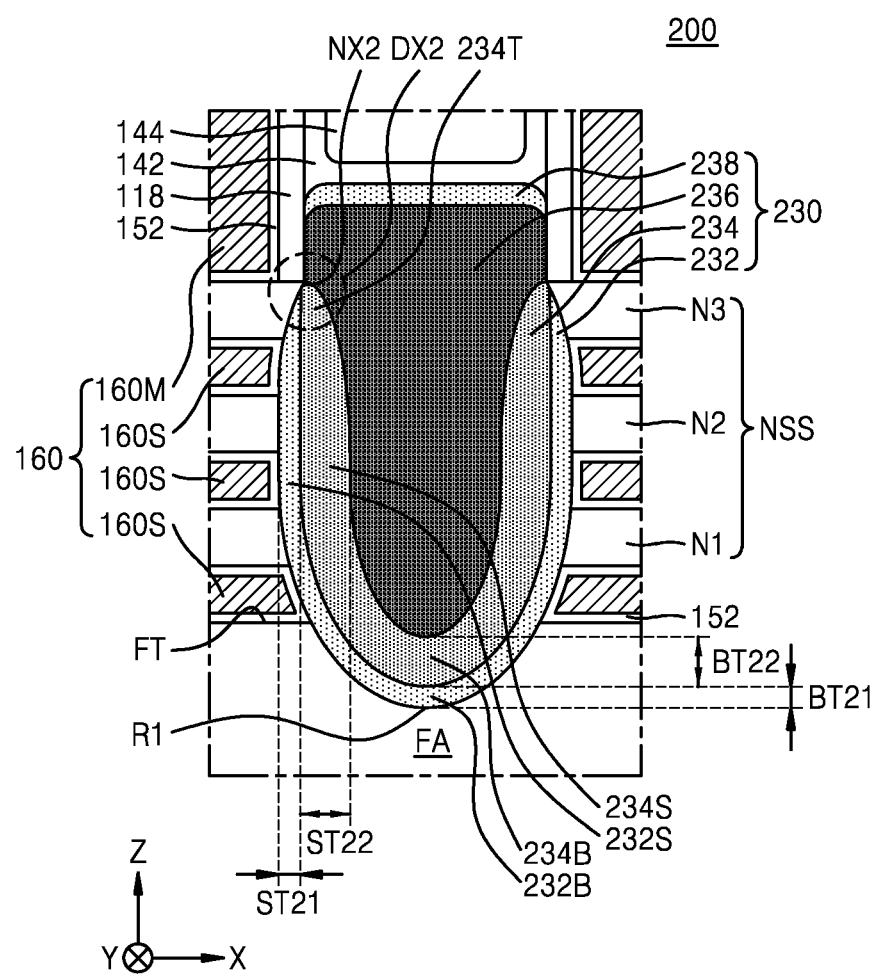
FIG. 5 is a cross-sectional view of an example of an IC device.

FIG. 5 is a cross-sectional view of an example of an IC device 200. FIG. 5 illustrates an enlarged cross-sectional configuration of a region corresponding to the local region "EX1" of FIG. 2A in the IC device 200.

Referring to FIG. 5, the IC device 200 may have substantially the same configuration as the IC device 100 described with reference to FIGS. 1 and 2A to 2D. However, the IC device 200 may include a source/drain region 230, which fills a recess R1 in a fin-type active region FA.

The source/drain region 230 may include a first buffer layer 232, a second buffer layer 234, a main body layer 236, and a capping layer 238, which are sequentially stacked in a direction away from the fin-type active region FA in a vertical direction (Z direction). The second buffer layer 234 may be between the first buffer layer 232 and the main body layer 236 to conformally cover a surface of the first buffer layer 232, which faces the main body layer 236.

A thickness of the second buffer layer 234 may be greater than a thickness of the first buffer layer 232 in a first lateral direction (X direction) from a sidewall of a nanosheet stack NSS. In addition, a thickness of the second buffer layer 234 may be greater than a thickness of the first buffer layer 232 in the vertical direction (Z direction) from a lowermost surface of the source/drain region 230.

More specifically, the first buffer layer 232 may include a side buffer portion 232S and a bottom buffer portion 232B. In the first lateral direction (X direction), the side buffer portion 232S may face each of a first nanosheet N1, a second nanosheet N2, and a third nanosheet N3, which are included in the nanosheet stack NSS. The bottom buffer portion 232B may face the fin-type active region FA in the vertical direction (Z direction). In the first buffer layer 232, a ratio of a thickness ST21 of the side buffer portion 232S to a thickness BT21 of the bottom buffer portion 232B may be in a range of about 0.9 to about 1.1.

The second buffer layer 234 may include a side buffer portion 234S and a bottom buffer portion 234B. The side buffer portion 234S may face each of the first to third nanosheets N1, N2, and N3 included in the nanosheet stack NSS in the first lateral direction (X direction). The bottom buffer portion 234B may face the fin-type active region FA in the vertical direction (Z direction). In the second buffer layer 234, a ratio of a thickness ST22 of the side buffer portion 234S to a thickness BT22 of the bottom buffer portion 234B may be in a range of about 0.9 to about 1.1.

The thickness ST22 of the side buffer portion 234S of the second buffer layer 234 may be greater than the thickness ST21 of the side buffer portion 232S of the first buffer layer 232, and the thickness BT22 of the bottom buffer portion 234B of the second buffer layer 234 may be greater than the thickness BT21 of the bottom buffer portion 232B of the first buffer layer 232. In some implementations, in the first buffer layer 232, each of the thickness ST21 of the side buffer portion 232S and the thickness BT21 of the bottom buffer portion 232B may be selected in a range of about 1 nm to about 5 nm, a range of about 1 nm to about 3 nm, or a range of about 1 nm to about 2 nm. In the second buffer layer 234, each of the thickness ST22 of the side buffer portion 234S and the thickness BT22 of the bottom buffer portion 234B may be selected in a range of about 3 nm to about 10 nm, a range of about 6 nm to about 9 nm, or a range of about 7 nm to about 8 nm. For example, each of the thickness ST21 of the side buffer portion 232S and the thickness BT21 of the bottom buffer portion 232B may be about 2 nm in the first buffer layer 232, and each of the thickness ST22 of the side buffer portion 234S and the thickness BT22 of the bottom buffer portion 234B may be about 8 nm in the second buffer layer 234, without being limited thereto.

Detailed configurations of the first buffer layer 232, the second buffer layer 234, the main body layer 236, and the capping layer 238 may be the same as those of the first buffer layer 132, the second buffer layer 134, the main body layer 136, and the capping layer 138, which have been described with reference to FIGS. 2A to 2D.

As illustrated with a dashed circle DX2 in FIG. 5, the second buffer layer 234 may include a top buffer portion 234T in contact with the third nanosheet N3. In the second buffer layer 234, a thickness of the top buffer portion 234T may be less than the thickness ST22 of the side buffer portion 234A and be less than the thickness BT22 of the bottom buffer portion 234B. The top buffer portion 234T of the second buffer layer 234 may include a portion of which a thickness gradually reduces toward the third nanosheet N3.

As illustrated with the dashed line DX2 in FIG. 5, a contact portion NX2 of the third nanosheet N3, which is in contact with the second buffer layer 234, may be a portion adjacent to an uppermost surface of the third nanosheet N3. A vertical distance (a distance in a Z direction in FIG. 5) between the contact portion NX2 of the third nanosheet N3 and the uppermost surface of the third nanosheet N3 may be less than a vertical distance between the contact portion NX2 of the third nanosheet N3 and a lowermost surface of the third nanosheet N3. In some implementations, the vertical distance between the contact portion NX2 of the third nanosheet N3 and the uppermost surface of the third nanosheet N3 may be in a range of about 0 nm to about 1 nm, without being limited thereto. The vertical distance of the contact portion NX2 may be more than about 0 nm and less than or equal to about 2 nm, without being limited thereto.

Figure 6:
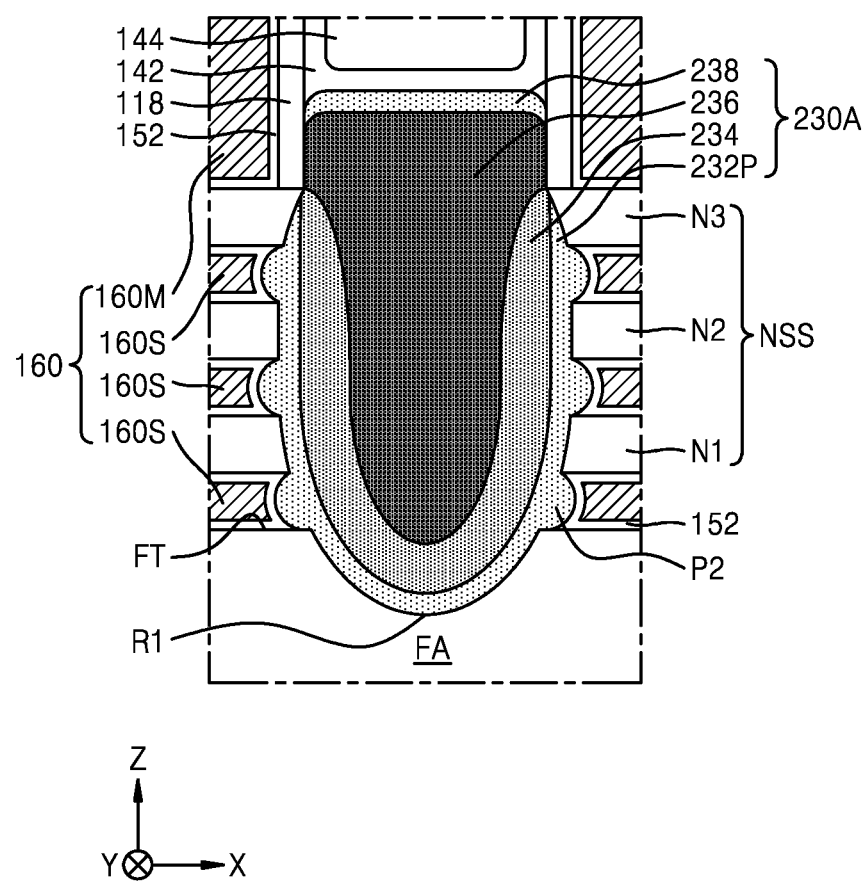
FIG. 6 is a cross-sectional view of an example of an IC device

FIG. 6 is a cross-sectional view of an example of an IC device 200A. FIG. 6 illustrates an enlarged cross-sectional configuration of a region corresponding to the local region "EX1" of FIG. 2A in the IC device 200A.

Referring to FIG. 6, the IC device 200A may have substantially the same configuration as the IC device 200 described with reference to FIG. 5. However, the IC device 200A may include a source/drain region 230A, which fills a recess R1 in a fin-type active region FA.

The source/drain region 230A may have substantially the same configuration as the source/drain region 230 described with reference to FIG. 5. However, the source/drain region 230A may include a first buffer layer 232P having a plurality of protrusions P2, which protrude toward a plurality of sub-gate portions 160S. A detailed configuration of the first buffer layer 232A may be the same as that of the first buffer layer 132 described with reference to FIGS. 2A to 2D.

Figure 7:
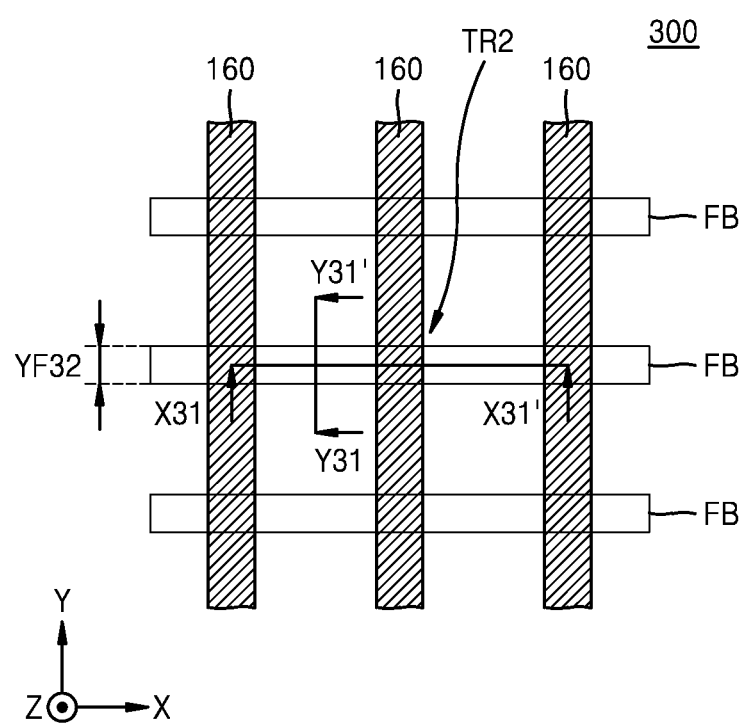
FIG. 7 is a plan layout diagram of an example of an IC device

FIG. 7 is a plan layout diagram of an example of an IC device 300.

Referring to FIG. 7, the IC device 300 may include a fin-type active region FB and a gate line 160, which is on the fin-type active region FB and extends along a second lateral direction (Y direction). A PMOS transistor TR2 may be formed at each of portions where a plurality of fin-type active regions FB intersect with a plurality of gate lines 160.

In FIG. 7, a cross-sectional configuration taken along line X31-X31' may be substantially the same as that shown in FIG. 2A. In FIG. 7, a cross-sectional configuration taken along line Y31-Y31' may be substantially the same as that shown in FIG. 2B. However, in the IC device 300, a width YF32 of the fin-type active region FB may be greater than a width (see YF1 in FIG. 1) of the fin-type active region FA shown in FIGS. 1, 2A, and 2B. In some implementations, the width YF1 of the fin-type active region FA shown in FIGS. 1, 2A, and 2B may be selected in a range of about 5 nm to about 25 nm, and the width YF32 of the fin-type active region FB shown in FIG. 7 may be selected in a range of about 26 nm to about 45 nm, but is not limited thereto.

In the IC device 300, a nanosheet stack that is similar to the nanosheet stack NSS described with reference to FIGS. 2A and 2D may be on the fin-type active region FB. However, the nanosheet stack on the fin-type active region FB may have a greater width than the nanosheet stack NSS shown in FIGS. 2A and 2D in the second lateral direction (Y direction).

Figure 8:
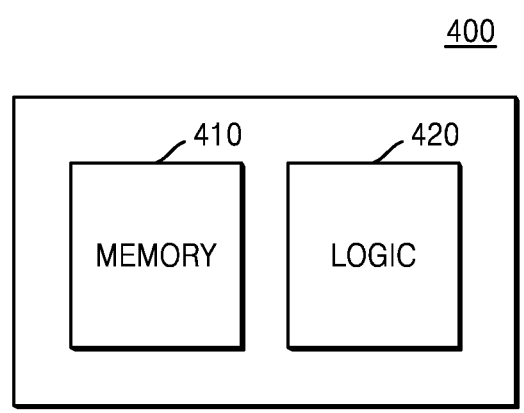
FIG. 8 is a block diagram of an example of an IC device.

FIG. 8 is a block diagram of an example of an IC device 400.

Referring to FIG. 8, the IC device 400 may include a memory region 410 and a logic region 420. The memory region 410 may include at least one of configurations of the IC devices 100, 100A, 100B, 200, and 200A, which have been described with reference to FIGS. 1 to 6. The memory region 410 may include at least one of static random access memory (SRAM), dynamic RAM (DRAM), magnetic RAM (MRAM), resistive RAM (RRAM), and phase-change RAM (PRAM). For example, the memory region 410 may include SRAM. The logic region 420 may include the configuration described with reference to FIG. 7. The logic region 420 may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch.

Figure 9:
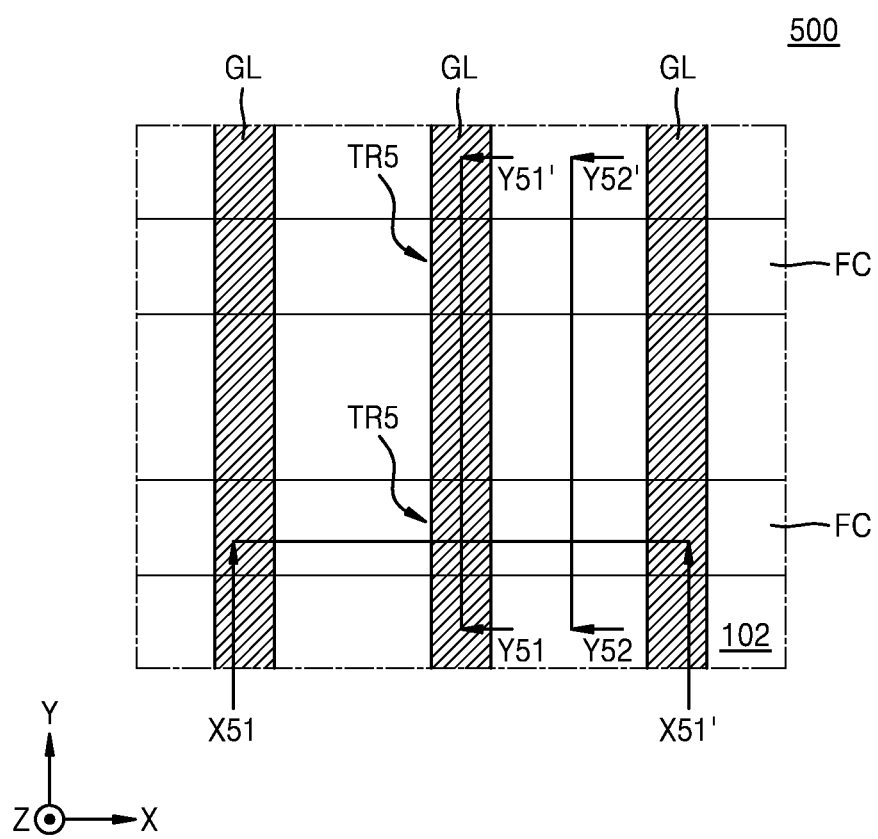
FIG. 9 is a layout diagram of an example of an IC device
Figure 10A:
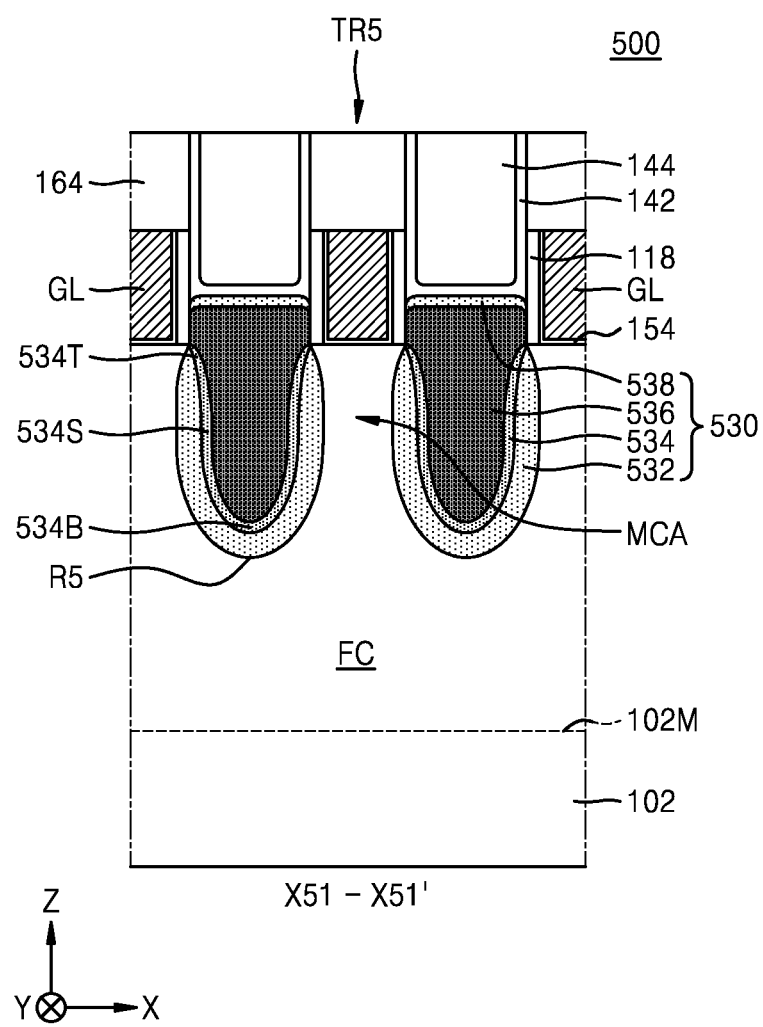
FIG. 10A is a cross-sectional view taken along line X51-X51' of FIG. 9.
Figure 10B:
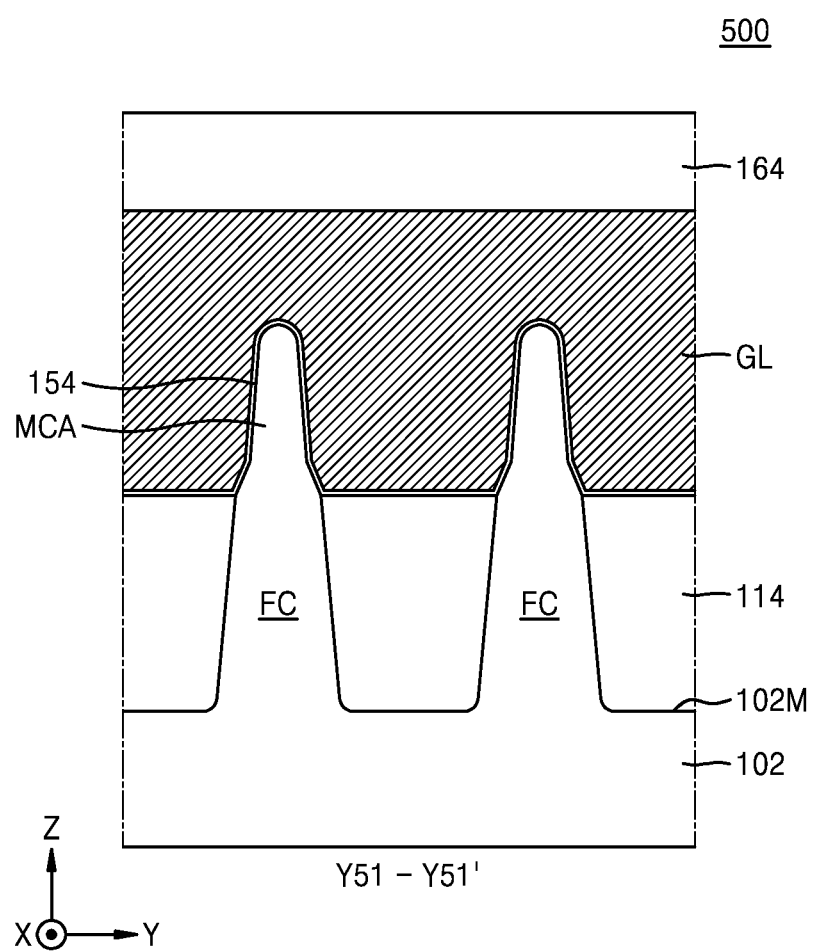
FIG. 10B is a cross-sectional view taken along line Y51-Y51' of FIG. 9.
Figure 10C:
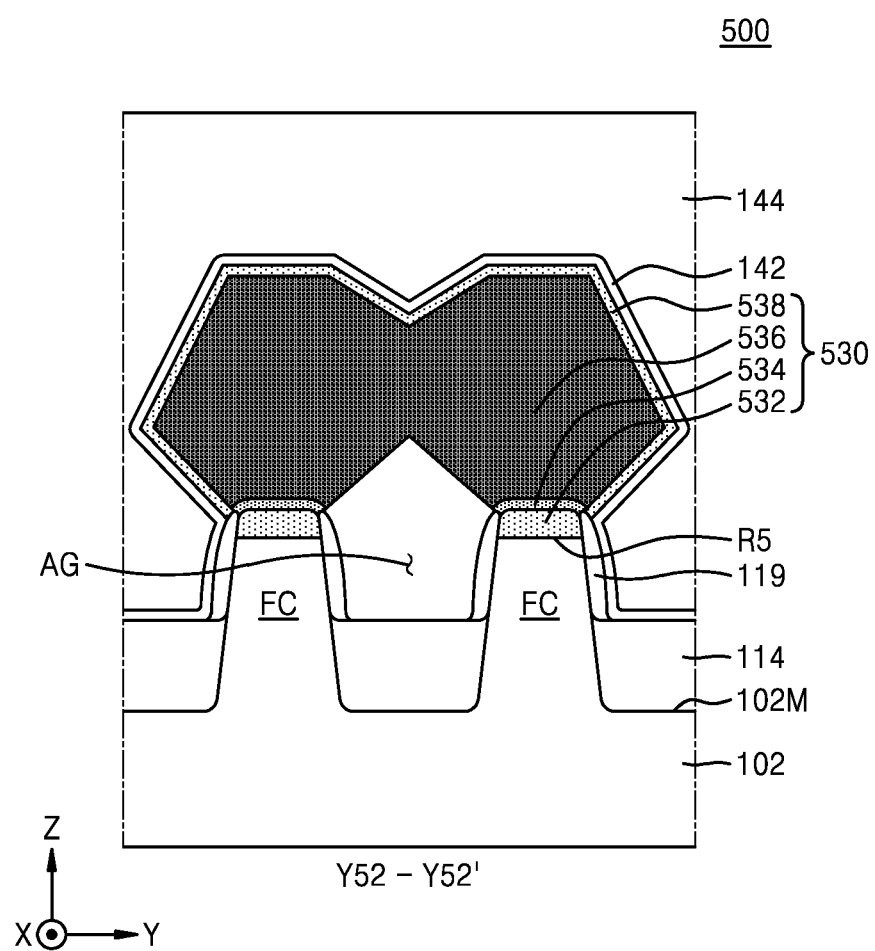
FIG. 10C is a cross-sectional view taken along line Y52-Y52' of FIG. 9.

FIG. 9 is a layout diagram of an example of an IC device 500. FIG. 10A is a cross-sectional view taken along line X51-X51' of FIG. 9. FIG. 10B is a cross-sectional view taken along line Y51-Y51' of FIG. 9. FIG. 10C is a cross-sectional view taken along line Y52-Y52' of FIG. 9. In FIGS. 9 and 10A to 10C, the same reference numerals are used to denote the same elements as in FIGS. 1 and 2A to 2D, and detailed descriptions thereof are omitted.

The IC device 500 may include a plurality of PMOS transistors TR5 formed on a fin-type active region FC. The plurality of PMOS transistors TR5 may constitute a logic circuit or a memory device.

The IC device 500 may include a plurality of fin-type active regions FC and a plurality of main channel regions MCA. The plurality of fin-type active regions FC may protrude from a substrate 102 in a vertical direction (Z direction) and extend along a first lateral direction (X direction). The plurality of main channel regions MCA may protrude upward in the vertical direction (Z direction) from the plurality of fin-type active regions FC, respectively, and be integrally connected to the fin-type active regions FC, respectively.

As shown in FIGS. 10B and 10C, a device isolation film 114 covering both sidewalls of each of the plurality of fin-type active regions FC may be on a substrate 102. As shown in FIGS. 9, 10A, and 10B, a plurality of gate lines GL may be on the fin-type active region FC. Each of the plurality of gate lines GL may extend along a second lateral direction (Y direction). As shown in FIG. 10B, each of the plurality of main channel regions MCA may be surrounded by the gate line GL. A constituent material of the plurality of gate lines GL is substantially the same as that of the gate line 160, which has been described with reference to FIGS. 1, 2A, and 2D. A plurality of FETs (see TR5 in FIG. 9) may be formed in regions where the plurality of fin-type active regions FC intersect with the plurality of gate lines GL.

In some implementations, the fin-type active region FC and the main channel region MCA may include the same material as each other. For example, each of the fin-type active region FC and the main channel region MCA may include a silicon (Si) layer. In some implementations, the main channel region MCA may include an undoped Si layer, a silicon layer doped with a p-type dopant, or a silicon layer doped with an n-type dopant.

As shown in FIG. 10A, a plurality of recesses R5 may be formed in the fin-type active region FC. In the first lateral direction (X direction), a width of the main channel region MCA may be defined by two adjacent ones of the plurality of recesses R5. A plurality of source/drain regions 530 may respectively be in the plurality of recesses R5 on the fin-type active region FC. The main channel region MCA may have surfaces in contact with a pair of source/drain regions 530 adjacent to both sides thereof.

Each of the plurality of source/drain regions 530 may be adjacent to at least one gate line GL selected from the plurality of gate lines GL. Each of the plurality of source/drain regions 530 may include a first buffer layer 532, a second buffer layer 534, a main body layer 536, and a capping layer 538, which are sequentially stacked in a direction away from the fin-type active region FC in the vertical direction (Z direction). The second buffer layer 534 may be between the first buffer layer 532 and the main body layer 536 to conformally cover a surface of the first buffer layer 532, which faces the main body layer 136.

In each of the plurality of source/drain regions 530, the second buffer layer 534 may include a side buffer portion 534S, a bottom buffer portion 532B, and a top buffer portion 534T. The side buffer portion 534S may face the main channel region MCA with the first buffer layer 532 therebetween in the first lateral direction (X direction). The bottom buffer portion 532B may face the fin-type active region FC with the first buffer layer 532 therebetween in the vertical direction (Z direction). The top buffer portion 534T may be in contact with the main channel region MCA. The concentration of boron in the second buffer layer 534 may be higher than the concentration of boron in the first buffer layer 532 and lower than the concentration of boron in the main body layer 536. A difference between the concentration of boron in the second buffer layer 534 and the concentration of boron in the first buffer layer 532 may be greater than a difference between the concentration of boron in the main body layer 536 and the concentration of boron in the second buffer layer 534. Each of the plurality of source/drain regions 530 may have a top surface that is at a higher vertical level than an uppermost surface of the main channel region MCA. Detailed configurations of the first buffer layer 532, the second buffer layer 534, the main body layer 536, and the capping layer 538 may be substantially the same as those of the first buffer layer 132, the second buffer layer 134, the main body layer 136, and the capping layer 138, which have been described with reference to FIGS. 2A to 2D. Specific compositions of respective constituent materials of the fin-type active region FC and the gate line GL may be substantially the same as those of the fin-type active region FA and the gate line 160, which have been described with reference to FIGS. 1 and 2A to 2D.

In some implementations, the IC device 500 may include the source/drain region 130B shown in FIG. 4, the source/drain region 230 shown in FIG. 5, the source/drain region 230A shown in FIG. 6, or source/drain regions having variously modified and changed structures within the scope thereof instead of the plurality of source/drain regions 530.

As shown in FIGS. 10A and 10B, a gate dielectric film 154 may be between the main channel region MCA and the gate line GL. The gate dielectric film 154 may cover a bottom surface and sidewalls of the gate line GL. The gate dielectric film 154 may have a surface in contact with the main channel region MCA. A detailed configuration of the gate dielectric film 154 is substantially the same as that of the gate dielectric film 152, which has been provided with reference to FIGS. 2A, 2B, and 2D.

As shown in FIG. 10A, both sidewalls of each of the plurality of gate lines GL2 may be covered by outer insulating spacers 118. The outer insulating spacers 118 may cover both sidewalls of the gate line GL on a top surface of the main channel region MCA. Each of the outer insulating spacers 118 may be apart from the gate line GL with the gate dielectric film 154 therebetween.

Each of the plurality of source/drain regions 530 may include a portion, which overlaps the outer insulating spacer 118 in the vertical direction (Z direction). For example, a portion of each of the plurality of source/drain regions 530, which overlaps the outer insulating spacer 118 in the vertical direction (Z direction), may have a width selected in a range from about 0 nm to about 4 nm in the first lateral direction (X direction), without being limited thereto. Each of the plurality of source/drain regions 530 and a plurality of outer insulating spacers 118 may be covered by an insulating liner 142. An inter-gate dielectric film 144 may be on the insulating liner 142.

As shown in FIG. 10C, a plurality of recess-side insulating spacers 119 covering sidewalls of the fin-type active region FC under the source/drain region 530 may be on a top surface of the device isolation film 114. In some implementations, each of the plurality of recess-side insulating spacers 119 may be integrally connected to the outer insulating spacer 118 adjacent thereto. An air gap AG may be in a space defined by the recess-side insulating spacer 119 and the source/drain region 530 and the device isolation film 114, which are adjacent thereto.

Figure 11:
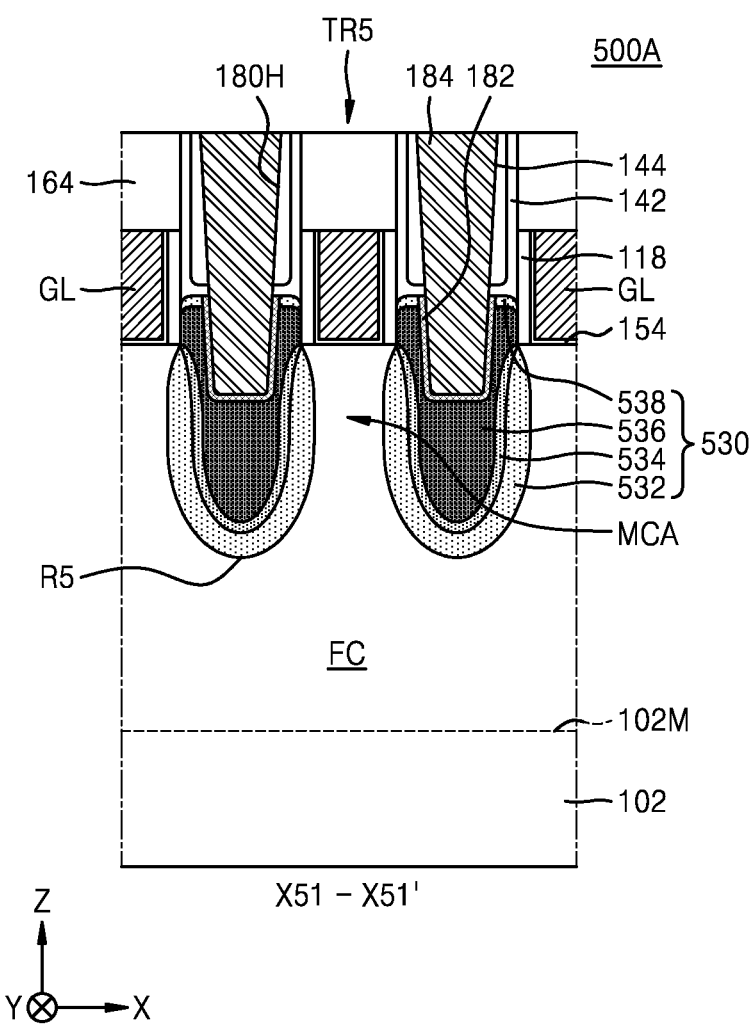
FIG. 11 is a cross-sectional view of an example of an IC device.

FIG. 11 is a cross-sectional view of an example of an IC device 500A. FIG. 11 illustrates some components in a portion corresponding to a cross-section taken along line X51-X51' of FIG. 9. In FIG. 11, the same reference numerals are used to denote the same elements as in FIGS. 9 and 10A to 10C, and detailed descriptions thereof are omitted.

Referring to FIG. 11, the IC device 500A may have substantially the same configuration as the IC device 500 described with reference to FIGS. 9 and 10A to 10C. However, the IC device 500A may further include a plurality of source/drain contacts 184 on a plurality of source/drain regions 530. Each of the plurality of source/drain contacts 184 may extend along a vertical direction (Z direction) between a pair of gate lines GL, which are adjacent to each other, from among the plurality of gate lines GL. Each of the plurality of source/drain contacts 184 may fill a contact hole 180H, which passes through an inter-gate dielectric film 144 and an insulating liner 142 in the vertical direction (Z direction) and extends into the source/drain region 530. A metal silicide film 182 may be between the source/drain region 530 and the source/drain contact 184. Detailed configurations of the metal silicide film 182 and the source/drain contact 184 may be substantially the same as those described with reference to FIG. 3.

In the IC devices 100, 100A, 100B, 200, 200A, 300, 400, 500, and 500A according to the examples described with reference to FIGS. 1 to 11, a source/drain region included in an FET may include a first buffer layer, a second buffer layer, and a main body layer, which are sequentially stacked in a direction away from a fin-type active region. The second buffer layer may be between the first buffer layer and the main body layer to conformally cover a surface of the first buffer layer, which faces the main body layer. Accordingly, the performance of a transistor including the source/drain region may be improved, and the reliability of the IC device may be improved.

FIGS. 12A to 12L are cross-sectional views of a process sequence of an example method of manufacturing an IC device, according to an example of an implementation. An example method of manufacturing the IC device 100 shown in FIGS. 1 and 2A to 2D will now be described with reference to FIGS. 12A to 12L. In FIGS. 12A to 12L, the same reference numerals are used to denote the same elements as in FIGS. 1 and 2A to 2D, and detailed descriptions thereof are omitted.

Figure 12A:
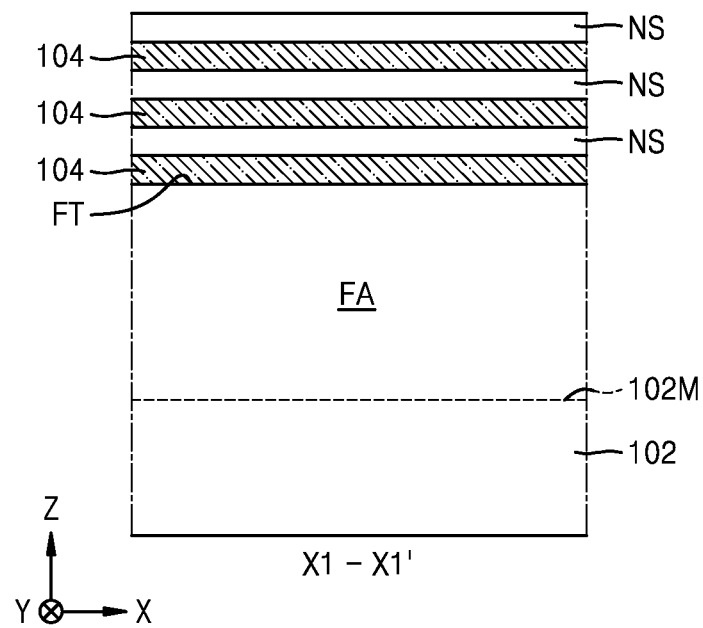
FIGS. 12A to 12L are cross-sectional views of a process sequence of a example of a method of manufacturing an IC device.

Referring to FIG. 12A, a plurality of sacrificial semiconductor layers 104 and a plurality of nanosheet semiconductor layers NS may be alternately stacked one by one on a substrate 102. Portions of the plurality of sacrificial semiconductor layers 104, the plurality of nanosheet semiconductor layers NS, and the substrate 102 may be etched to define a plurality of fin-type active regions FA in the substrate 102. Thereafter, a preliminary device isolation film may be formed to cover sidewalls of each of the plurality of fin-type active regions FA. The preliminary device isolation film may be a preliminary structure for forming the device isolation film (see device isolation film 114 in FIG. 2B) shown in FIG. 2B. The stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 and the plurality of nanosheet semiconductor layers NS may include semiconductor materials having different etch selectivities. In some implementations, the plurality of nanosheet semiconductor layers NS may include a silicon (Si) layer, and the plurality of sacrificial semiconductor layers 104 may include a silicon germanium (SiGe) layer. In some implementations, the plurality of sacrificial semiconductor layers 104 may have a constant Ge concentration. The SiGe layer included in the plurality of sacrificial semiconductor layers 104 may have a constant Ge concentration, which is selected in a range of about 5 at % to about 60 at %, for example, about 10 at % to about 40 at %. The Ge concentration of the SiGe layer included in the plurality of sacrificial semiconductor layers 104 may be variously selected as needed.

Figure 12B:
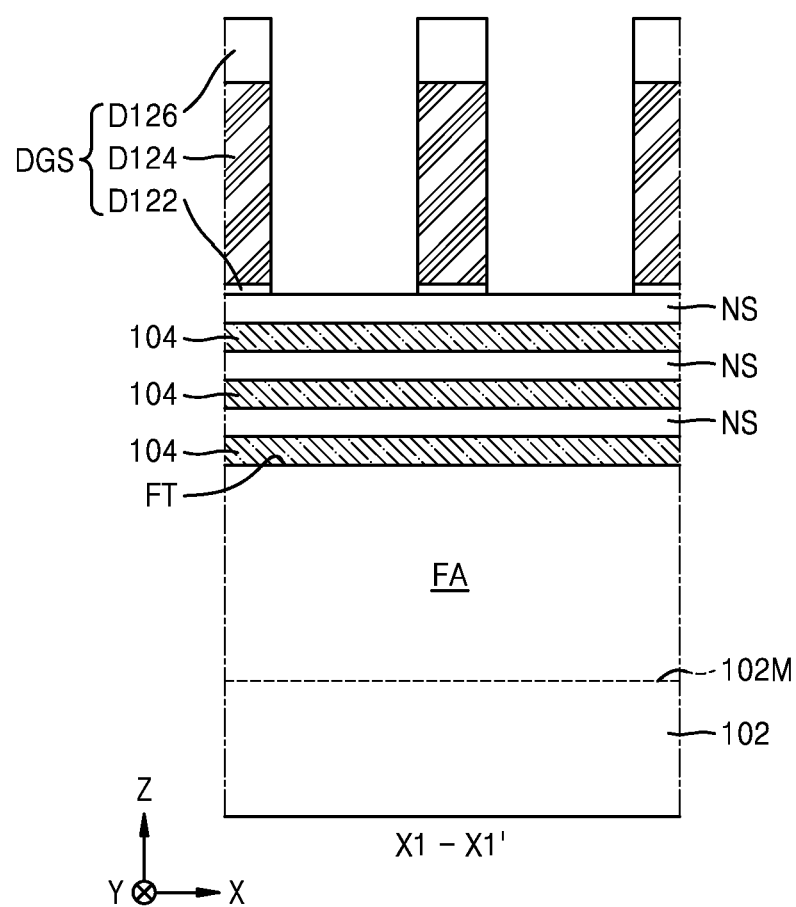

Referring to FIG. 12B, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend along a second lateral direction (Y direction). Each of the plurality of dummy gate structures DGS may have a structure in which an oxide film D122, a dummy gate layer D124, and a capping layer D126 are sequentially stacked. In some implementations, the dummy gate layer D124 may include polysilicon, and the capping layer D126 may include a silicon nitride film.

Figure 12C:
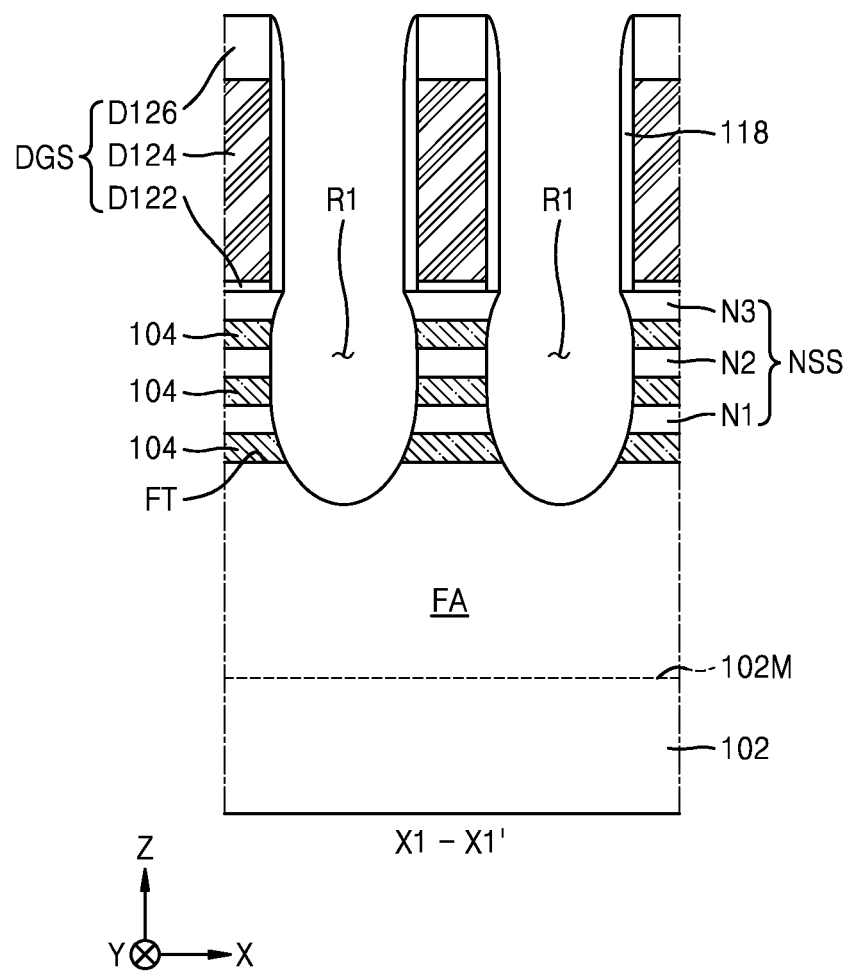

Referring to FIG. 12C, a plurality of outer insulating spacers 118 may be formed to cover both sidewalls of each of the plurality of dummy gate structures DGS. Thereafter, respective portions of the plurality of sacrificial semiconductor layers 104 and the plurality of nanosheet semiconductor layers NS and portions of the fin-type active region FA may be etched using the plurality of dummy gate structures DGS and the plurality of outer insulating spacers 118 as etch masks, and thus, the plurality of nanosheet semiconductor layers NS may be divided into a plurality of nanosheet stacks NSS, and a plurality of recesses R1 may be formed in an upper portion of the fin-type active region FA. Each of the plurality of nanosheet stacks NSS may include a first nanosheet N1, a second nanosheet N2, and a third nanosheet N3. The plurality of recesses R1 may be formed using a dry etching process, a wet dry etching process or a combination thereof.

After the plurality of recesses R1 are formed, the recess-side insulating spacers 119 shown in FIG. 2B may be formed on both sidewalls of the fin-type active region FA, and a height of the preliminary device isolation film formed in the process described with reference to FIG. 12A may be reduced. Thus, the device isolation film 114 shown in FIG. 2B may be obtained.

Figure 12D:
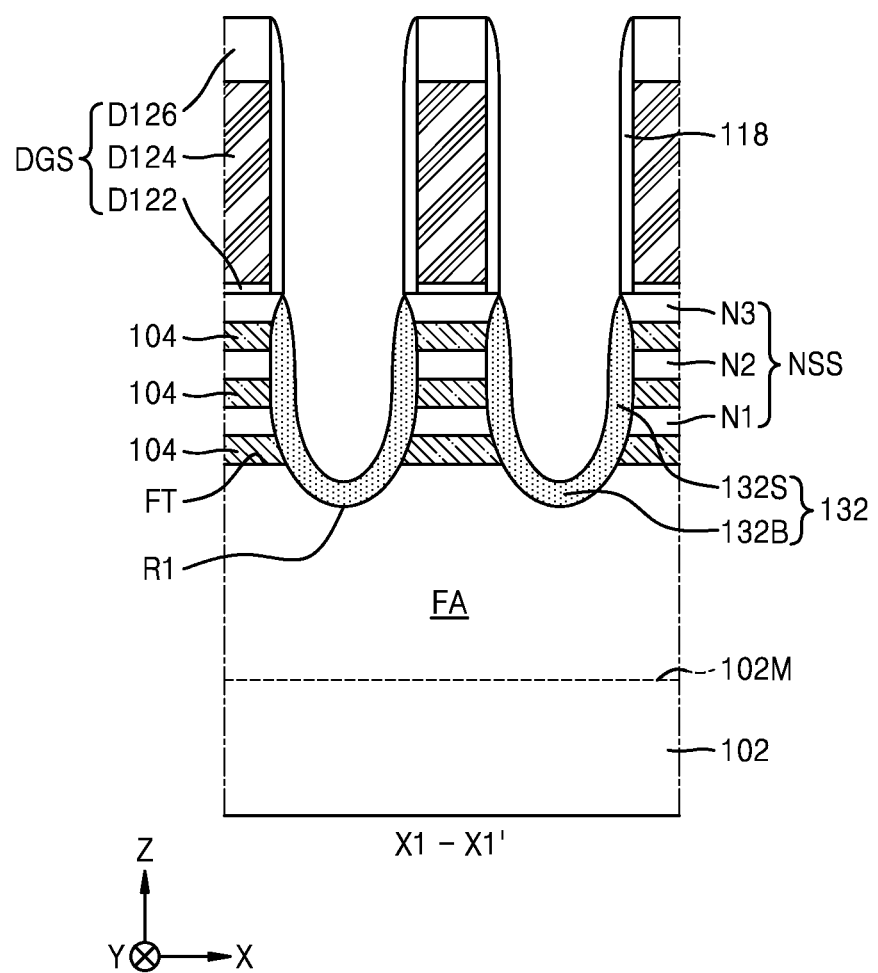

Referring to FIG. 12D, a first buffer layer 132 may be formed on the fin-type active region FA on both sides of each of the plurality of nanosheet stacks NSS.

In some implementations, to form the first buffer layer 132, a semiconductor material may be epitaxially grown from a surface of the fin-type active region FA exposed at a bottom surface of the recess R1, a sidewall of each of the first to third nanosheets N1, N2, and N3 included in the nanosheet stack NSS, and a sidewall of each of the plurality of sacrificial semiconductor layers 104.

In some implementations, to form the first buffer layer 132, a low-pressure chemical vapor deposition (LPCVD) process, a selective epitaxial growth (SEG) process, or a cyclic deposition and etching (CDE) process may be performed by using source materials including an element semiconductor precursor. The element semiconductor precursor may include a silicon (Si) source and a germanium (Ge) source.

In some implementations, to form the first buffer layer 132, the Si source and the Ge source may be used. Silane ($SiH_4$), disilane ($Si_2H_6$), trisilane ($Si_3H_8$), and/or dichlorosilane ($SiH_2Cl_2$) may be used as the Si source, without being limited thereto. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source, without being limited thereto. When the first buffer layer 132 includes a SiGe layer doped with boron (B) atoms, diborane ($B_2H_6$), triborane, tetraborane, and/or pentaborane may be used as a B source, without being limited thereto.

To form the first buffer layer 132, an epitaxial growth rate of the first buffer layer 132 and supply amounts of source gases may be controlled such that a ratio of a thickness (see ST1 in FIG. 2D) of a side buffer portion 132S to a thickness (see BT1 in FIG. 2D) of a bottom buffer portion 132B is in a range of about 0.9 to about 1.1 in the first buffer layer 132.

Figure 12E:
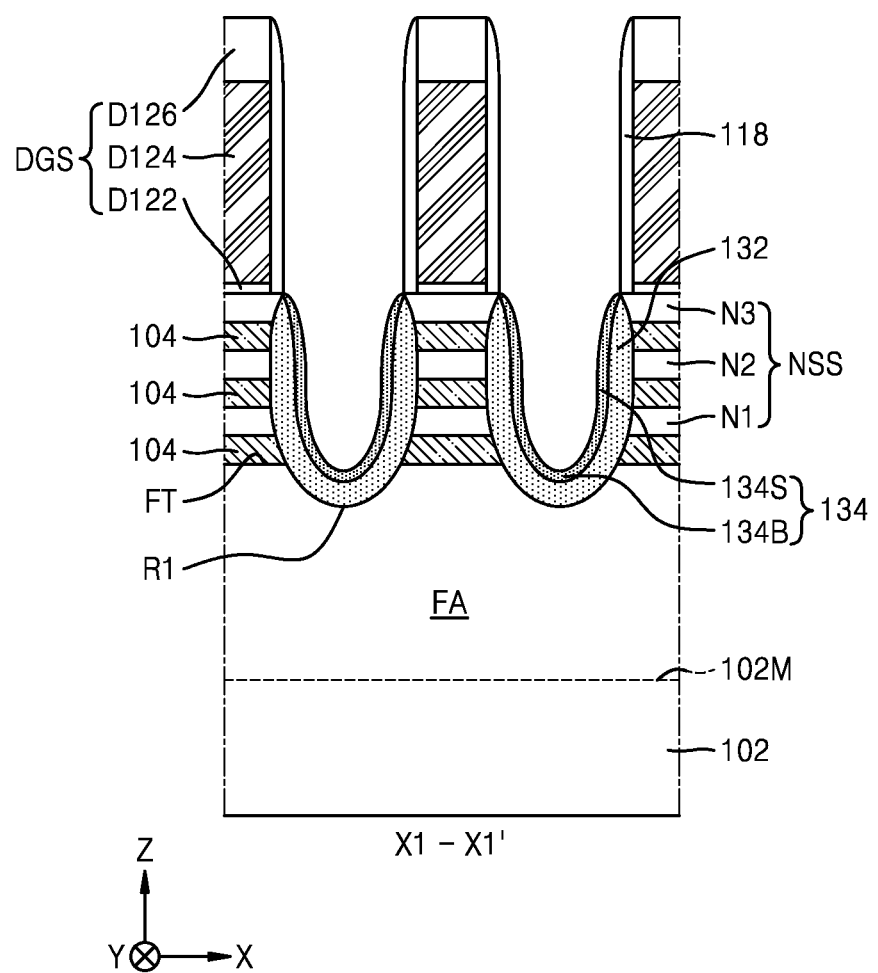

Referring to FIG. 12E, in the resultant structure of FIG. 12D, a second buffer layer 134 may be formed on the first buffer layer 132.

In some implementations, to form the second buffer layer 134, a process that is substantially similar to the process of forming the first buffer layer 132, which has been described with reference to FIG. 12D, may be performed. However, to form the second buffer layer 134, a partial pressure of each of the Si source, the Ge source, and the B source supplied onto the substrate 102 may be sufficiently increased. Accordingly, during the growth of the second buffer layer 134 from a surface of the first buffer layer 132, a growth rate of a SiGe layer grown from the surface of the first buffer layer 132 in a direction (or Z direction of FIG. 12E) that is perpendicular to a plane {100} may become substantially equal to a growth rate of a SiGe layer grown from the surface of the first buffer layer 132 in a direction (or X direction in FIG. 12E) that is perpendicular to a plane {110}.

In some implementations, a process temperature in an epitaxial growth process for forming the second buffer layer 134 as described with reference to FIG. 12E may be lower than a process temperature in an epitaxial growth process for forming the first buffer layer 132 as described with reference to FIG. 12D. In some implementations, the epitaxial growth process for forming the first buffer layer 132 as described with reference to FIG. 12D may be performed at a temperature of about 600° C. to about 620° C., for example, about 610° C., without being limited thereto. The epitaxial growth process for forming the second buffer layer 134 as described with reference to FIG. 12E may be performed at a temperature of about 560° C. to about 590° C., for example, about 580° C., without being limited thereto.

In the second buffer layer 134 obtained as a result of the method described above, a ratio of a thickness (see ST2 in FIG. 2D) of a side buffer portion 134S to a thickness (see BT2 in FIG. 2D) of a bottom buffer portion 134B may be in a range of about 0.9 to about 1.1.

In a comparative example, during the formation of the second buffer layer 134, when a partial pressure of each of a Si source, a Ge source, and a B source supplied to the substrate 102 is not sufficient, at least some of portions of the first buffer layer 132, which face each of the first to third nanosheets N1, N2, and N3 (e.g., portions of the first buffer layer 132, which face the third nanosheet N3 on a relatively upper side or at least some of the second and third nanosheets N2 and N3), may not be covered by the second buffer layer 134, and the second buffer layer 134 covering the first buffer layer 132 may be formed only in a relatively lower portion of the recess R1. In this case, sufficient stress may not be applied to the nanosheet stack NSS in a finally obtained source/drain region, a resistance of the source/drain region may be increased, and the electrical performance of the source/drain region may deteriorate.

In the method of manufacturing the IC device according to the disclosed examples, by using the processes described with reference to FIG. 12E, the second buffer layer 134 may be formed to conformally cover all exposed surfaces of the first buffer layer 132. Accordingly, a resistance of a source/drain region 130 to be formed may be reduced, the performance of a transistor including the source/drain region 130 may be improved, and the reliability of the IC device 100 may be improved.

Figure 12F:
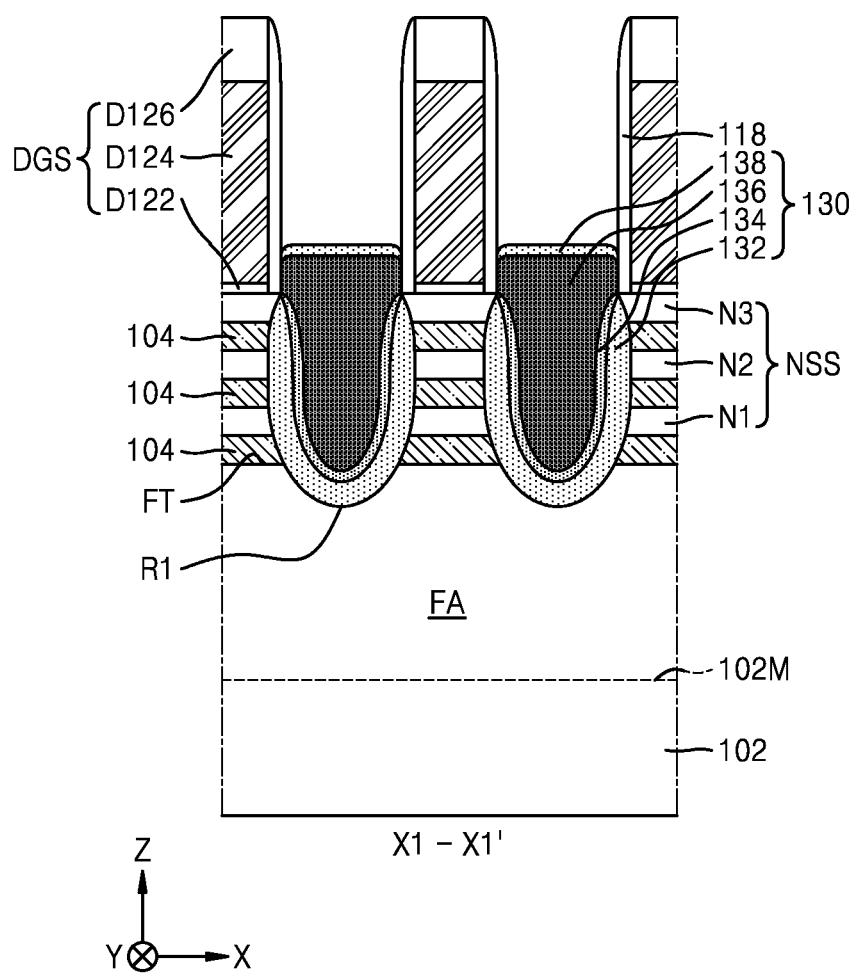

Referring to FIG. 12F, in the resultant structure of FIG. 12E, a main body layer 136 and a capping layer 138 may be sequentially formed on the second buffer layer 134 to form the source/drain region 130.

To form the main body layer 136, processes that are similar to the process of forming the first buffer layer 132, which has been described with reference to FIG. 12D, or the process of forming the second buffer layer 134, which has been described with reference to FIG. 0.12E, may be performed. However, as described above with reference to FIG. 12E, the process temperature in the epitaxial growth process for forming the main body layer 136 may be lower than the process temperature in the epitaxial growth process for forming the second buffer layer 134. In some implementations, the epitaxial growth process for forming the main body layer 136 may be performed at a temperature of about 550° C. to about 580° C., for example, about 570° C., without being limited thereto. In some implementations, to form the main body layer 136, a Si source, a Ge source, and a B source may be used.

Figure 12G:
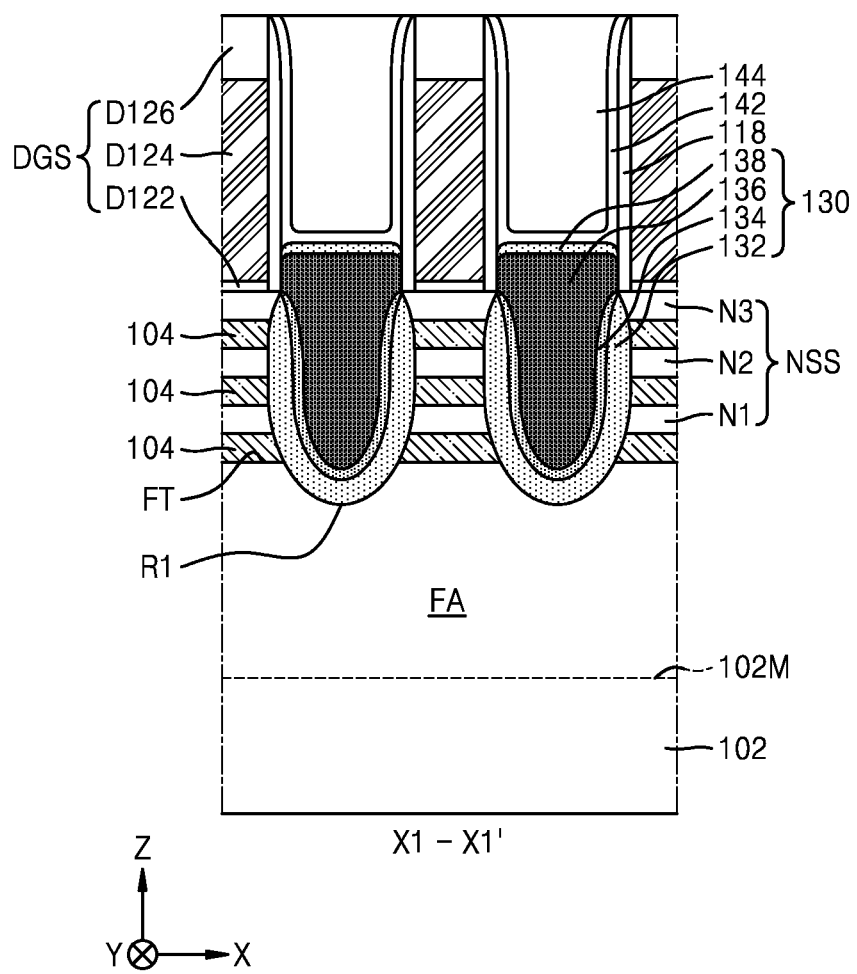

Referring to FIG. 12G, an insulating liner 142 may be formed to cover the resultant structure of FIG. 12F in which the plurality of source/drain regions 130 are formed, and an inter-gate dielectric film 144 may be formed on the insulating liner 142. The insulating liner 142 and the inter-gate dielectric film 144) may be planarized to expose a top surface of the capping layer D126.

Figure 12H:
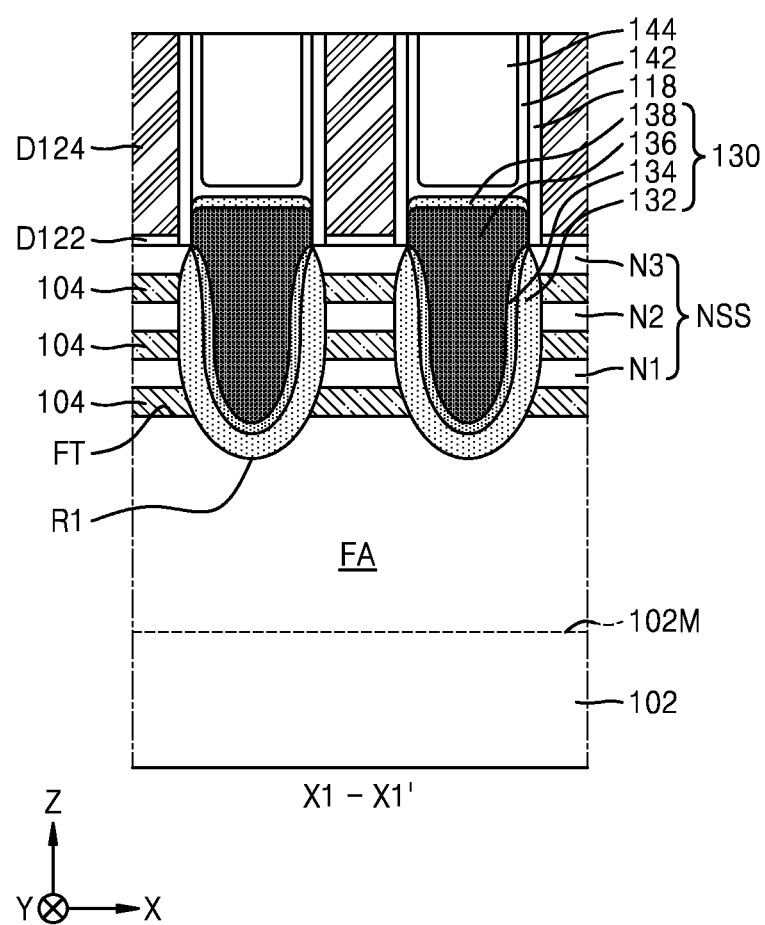

Referring to FIG. 12H, the capping layer D126 may be removed from the resultant structure of FIG. 12G to expose a top surface of the dummy gate layer D124. The insulating liner 142 and the inter-gate dielectric film 144 may be partially removed such that a top surface of the inter-gate dielectric film 144 becomes substantially the same level as the top surface of the dummy gate layer D124.

Figure 12I:
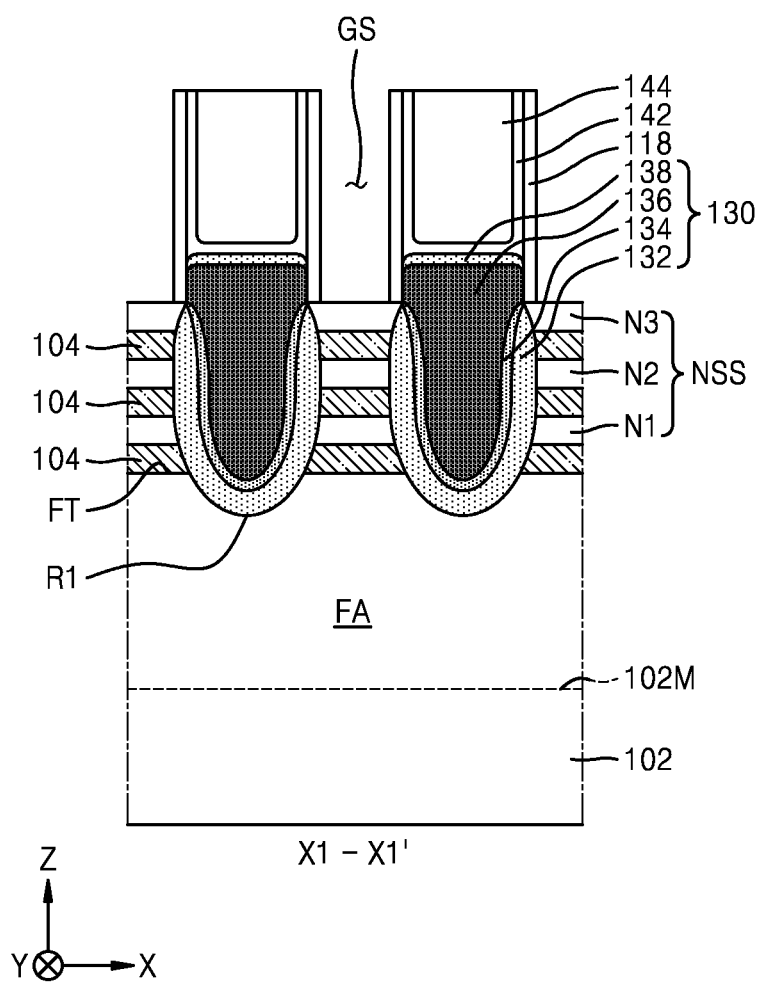

Referring to FIG. 12I, the dummy gate layer D124 and the oxide film D122 located thereunder may be removed from the resultant structure of FIG. 12H to prepare a gate space GS, and the plurality of nanosheet stacks NSS may be exposed through the gate space GS.

Figure 12J:
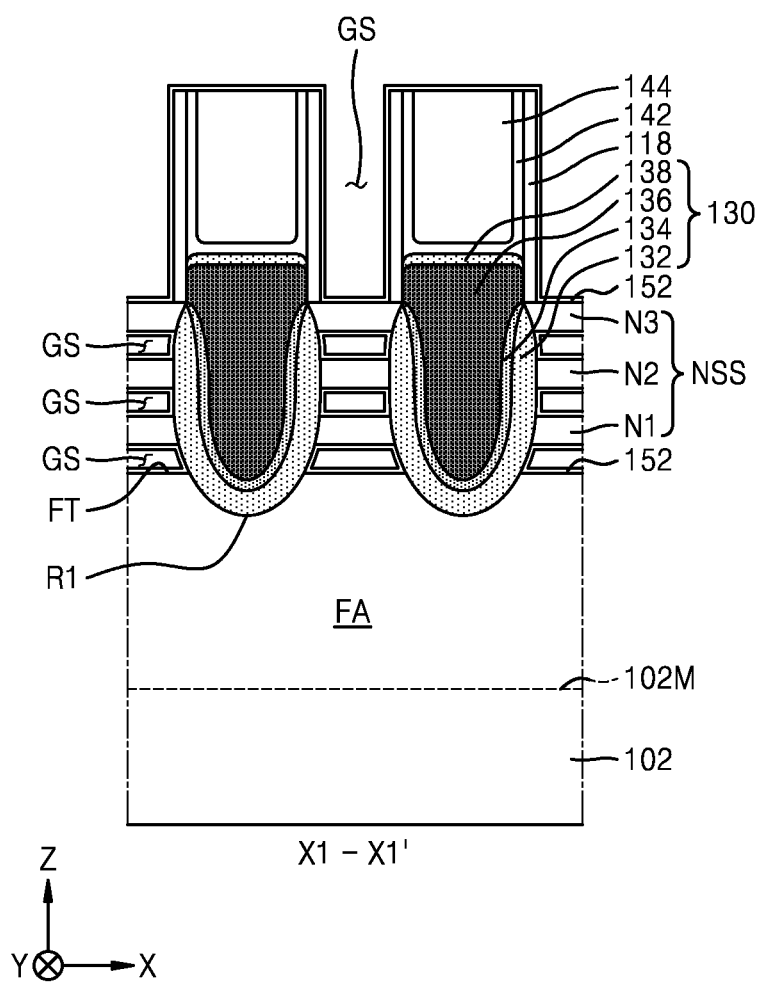

Referring to FIG. 12J, in the resultant structure of FIG. 12I, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region FA.

In some implementations, to selectively remove the plurality of sacrificial semiconductor layers 104, etch selectivities of the first to third nanosheets N1, N2, and N3 with respect to the plurality of sacrificial semiconductor layers 104 may be used. A liquid or gaseous etchant may be used to selectively remove the plurality of sacrificial semiconductor layers 104. In some implementations, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Thereafter, a gate dielectric film 152 may be formed to cover respective exposed surfaces of the first to third nanosheets N1, N2, and N3 and the fin-type active region FA. The gate dielectric film 152 may be formed using an atomic layer deposition (ALD) process.

Figure 12K:
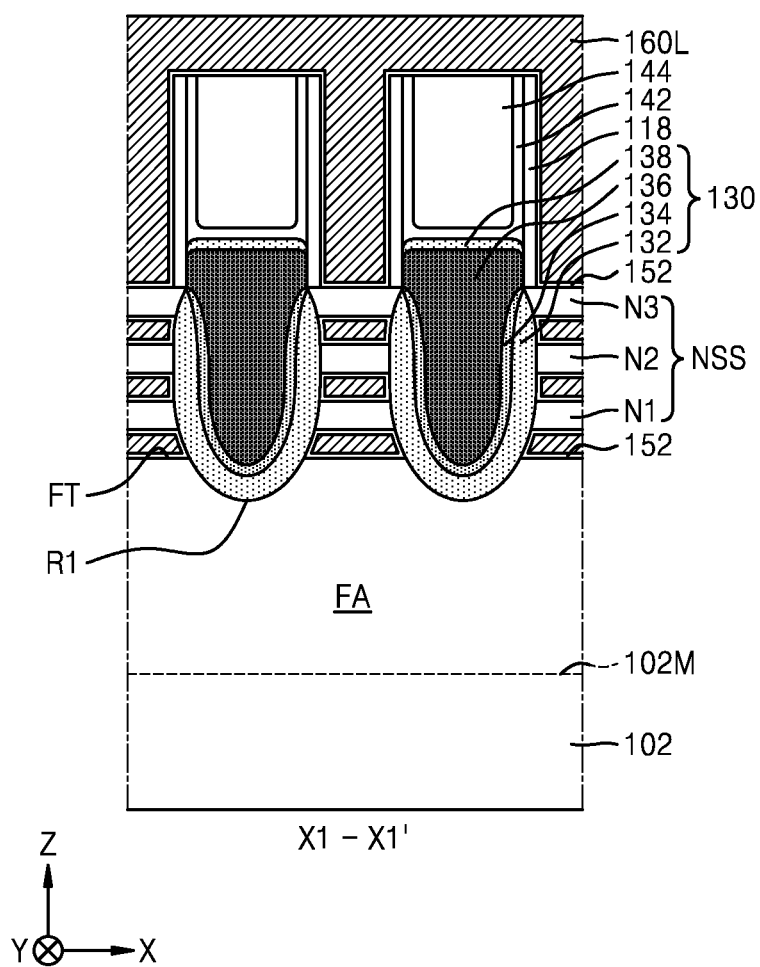

Referring to FIG. 12K, in the resultant structure of FIG. 12J, a gate-forming conductive layer 160L filling the gate space (see GS in FIG. 12J) and covering the top surface of the inter-gate dielectric film 144 may be formed on the gate dielectric film 152. The gate-forming conductive layer 160L may include a metal, a metal nitride, a metal carbide, or a combination thereof. The gate-forming conductive layer 160L may be formed using an ALD process or a CVD process.

Figure 12L:
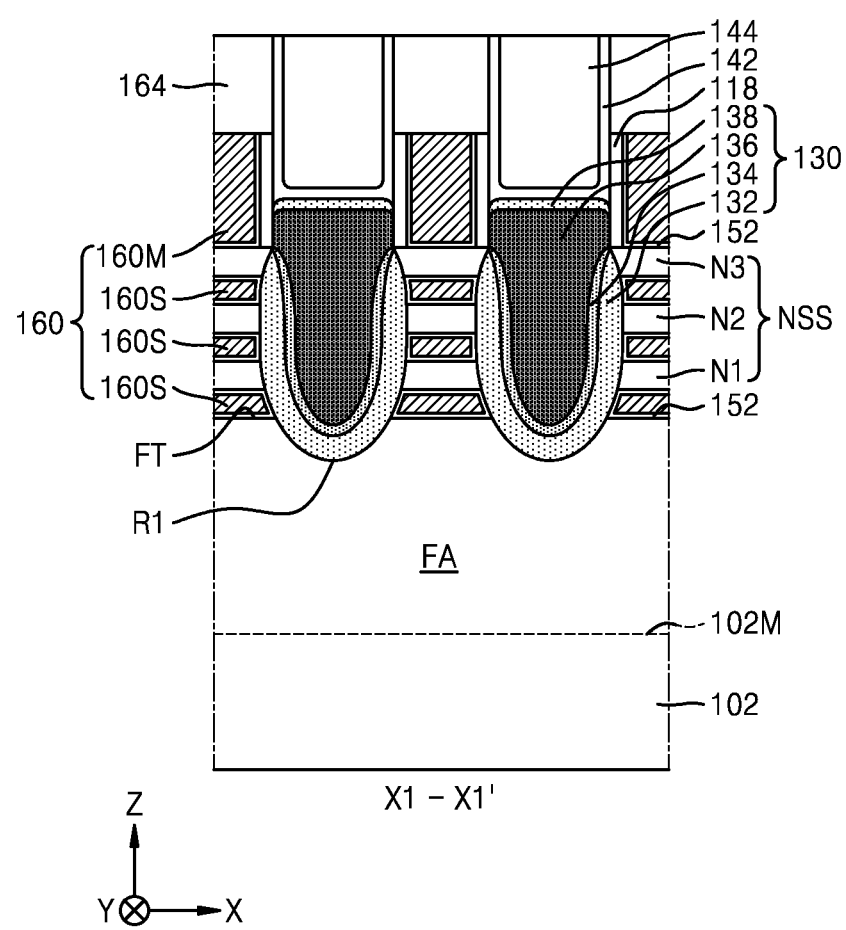

Referring to FIG. 12L, in the resultant structure of FIG. 12K, the gate-forming conductive layer 160L and the gate dielectric film 152 may be partially removed from top surfaces thereof to expose the top surface of the inter-gate dielectric film 144 and empty an upper portion of the gate space GS again to form a gate line 160. In this case, an upper portion of each of a plurality of outer insulating spacers 118 may also be consumed, and thus, a height of each of the plurality of outer insulating spacers 118 may be reduced. Thereafter, a capping insulating pattern 164 filling the gate space GS may be formed on the gate line 160.

Although the method of manufacturing the IC device 100 shown in FIGS. 1 and 2A to 2D, according to the example, have been described with reference to FIGS. 12A to 12L, it will be understood that the IC devices 100A, 100B, 200, 200A, 300, 400, 500, and 500A shown in FIGS. 3 to 11 and IC devices having various structures may be manufactured by making various modifications and changes within the scope of the subject matter of the present disclosure with reference to the descriptions provided with reference to FIGS. 12A to 12L.

While the subject matter of the present disclosure has been particularly shown and described with reference to embodiments thereof, it will be understood that various changes in form and details may be made therein without departing from the spirit and scope of the following claims.

What is claimed is:

1. An integrated circuit device comprising:
   a fin-type active region extending along a first lateral direction on a substrate;
   a channel region on the fin-type active region;
   a gate line surrounding the channel region on the fin-type active region, the gate line extending along a second lateral direction, wherein the second lateral direction intersects with the first lateral direction; and
   a source/drain region adjacent to the gate line on the fin-type active region, the source/drain region having a sidewall facing the channel region,
   wherein the source/drain region comprises a first buffer layer, a second buffer layer, and a main body layer, which are sequentially stacked in a vertical direction away from the fin-type active region, wherein the first buffer layer, the second buffer layer, and the main body layer each comprise a $Si_{1-x}Ge_x$ layer doped with a p-type dopant and having different germanium (Ge) concentrations from each other, wherein x is greater than 0,
   the second buffer layer is between the first buffer layer and the main body layer to conformally cover a surface of the first buffer layer that faces the main body layer, and
   the second buffer layer comprises a side buffer portion facing the channel region and a bottom buffer portion facing the fin-type active region, and a ratio of a thickness of the side buffer portion to a thickness of the bottom buffer portion is in a range of about 0.9 to about 1.1.

2. The integrated circuit device of claim 1, wherein a Ge concentration of the second buffer layer is higher than a Ge concentration of the first buffer layer and lower than a Ge concentration of the main body layer.

3. The integrated circuit device of claim 1, wherein the p-type dopant comprises boron (B), and
   the concentration of boron in the second buffer layer is higher than the concentration of boron in the first buffer layer and lower than the concentration of boron in the main body layer.

4. The integrated circuit device of claim 1, wherein the second buffer layer comprises a top buffer portion in contact with the fin-type active region,
   the top buffer portion has a smaller thickness than each of the bottom buffer portion and the side buffer portion, and
   the top buffer portion comprises a portion of which a thickness gradually reduces toward the fin-type active region.

5. The integrated circuit device of claim 1, wherein the second buffer layer is in contact with the fin-type active region, and
   a portion of the fin-type active region, which is in contact with the second buffer layer, is closer to an uppermost surface of the fin-type active region than a lowermost surface of the fin-type active region.

6. The integrated circuit device of claim 1, wherein, in the vertical direction from a lowermost surface of the source/drain region, the first buffer layer has a first thickness, and the second buffer layer has a second thickness, wherein the second thickness is less than the first thickness.

7. The integrated circuit device of claim 1, wherein, in the vertical direction from a lowermost surface of the source/drain region, the first buffer layer has a first thickness, and the second buffer layer has a second thickness, wherein the second thickness is greater than the first thickness.

8. The integrated circuit device of claim 1, wherein the source/drain region further comprises a capping layer apart from the second buffer layer with the main body layer, and the capping layer comprises an undoped silicon (Si) layer, a Si layer doped with a p-type dopant, or a SiGe layer having a lower Ge concentration than the main body layer.

9. The integrated circuit device of claim 1, wherein the channel region comprises a nanosheet stack comprising a plurality of nanosheets, the plurality of nanosheets being apart from a fin top surface of the fin-type active region at different vertical distances and facing the fin top surface of the fin-type active region in the vertical direction, and,
in the source/drain region, each of the first buffer layer and the second buffer layer comprises portions respectively facing the plurality of nanosheets in the first lateral direction.

10. The integrated circuit device of claim 1, wherein the channel region comprises a nanosheet stack comprising a plurality of nanosheets, the plurality of nanosheets being apart from a fin top surface of the fin-type active region at different vertical distances and facing the fin top surface of the fin-type active region in the vertical direction, and,
in the source/drain region, the first buffer layer is in contact with each of the plurality of nanosheets, and the second buffer layer is in contact with only an uppermost nanosheet, which is farthest from the substrate from among the plurality of nanosheets.

11. The integrated circuit device of claim 1, wherein the channel region comprises a nanosheet stack comprising a plurality of nanosheets, the plurality of nanosheets being apart from a fin top surface of the fin-type active region at different vertical distances and facing the fin top surface of the fin-type active region in the vertical direction, and
an uppermost nanosheet, which is farthest from the substrate from among the plurality of nanosheets, comprises a contact portion in contact with the second buffer layer, and a vertical distance between the contact portion of the uppermost nanosheet and an uppermost surface of the uppermost nanosheet is less than a vertical distance between the contact portion and a lowermost surface of the uppermost nanosheet.

12. The integrated circuit device of claim 1, wherein the channel region comprises a nanosheet stack comprising a plurality of nanosheets, the plurality of nanosheets being apart from a fin top surface of the fin-type active region at different vertical distances and facing the fin top surface of the fin-type active region in the vertical direction,
the gate line comprises a main gate portion extending along the second lateral direction on the nanosheet stack and a plurality of sub-gate portions respectively between the plurality of nanosheets, and
the first buffer layer of the source/drain region comprises a plurality of protrusions facing the plurality of sub-gate portions in the first lateral direction, the plurality of protrusions protruding toward the plurality of sub-gate portions between the plurality of nanosheets, respectively.

13. The integrated circuit device of claim 1, wherein the channel region comprises a main channel region integrally connected to the fin-type active region in an upper portion of the fin-type active region and,
in the source/drain region, the second buffer layer comprises a side buffer portion and a top buffer portion, the side buffer portion facing the main channel region with the first buffer layer therebetween in the first lateral direction, the top buffer portion being in contact with the main channel region,
the concentration of boron in the second buffer layer is higher than the concentration of boron in the first buffer layer and lower than the concentration of boron in the main body layer, and
a first difference between the concentration of boron in the second buffer layer and the concentration of boron in the first buffer layer is greater than a second difference between the concentration of boron in the main body layer and the concentration of boron in the second buffer layer.

14. The integrated circuit device of claim 1, wherein the at least one of the source and the drain region comprises the source region and the drain region.

15. An integrated circuit device comprising:
a fin-type active region extending along a first lateral direction on a substrate;
a nanosheet stack comprising a plurality of nanosheets, the plurality of nanosheets being apart from a fin top surface of the fin-type active region at different vertical distances and facing the fin top surface of the fin-type active region in a vertical direction;
a gate line surrounding the plurality of nanosheets on the fin-type active region, the gate line extending along a second lateral direction that is perpendicular to the first lateral direction; and
a pair of source/drain regions on both sides of the gate line on the fin-type active region, the pair of source/drain regions each being in contact with the plurality of nanosheets,
wherein each of the pair of source/drain regions comprises a first buffer layer, a second buffer layer, and a main body layer, which are sequentially stacked in a direction away from the fin-type active region, wherein each of the first buffer layer, the second buffer layer, and the main body layer comprises a $Si_{1-x}Ge_x$ layer doped with a p-type dopant and have different germanium (Ge) concentrations from each other, wherein x is greater than 0,
the second buffer layer is between the first buffer layer and the main body layer to conformally cover a surface of the first buffer layer, which faces the main body layer, and
the second buffer layer comprises a side buffer portion facing the nanosheet stack and a bottom buffer portion facing the fin-type active region, and a ratio of a thickness of the side buffer portion to a thickness of the bottom buffer portion is in a range of about 0.9 to about 1.1.

16. The integrated circuit device of claim 15, wherein, in each of the pair of source/drain regions, the Ge concentration of the second buffer layer is higher than the Ge concentration of the first buffer layer and less than the Ge concentration of the main body layer, and the concentration of the p-type dopant in the second buffer layer is higher than the concentration of the p-type dopant in the first buffer layer and lower than the concentration of the p-type dopant in the main body layer.

17. The integrated circuit device of claim 15, wherein, in each of the pair of source/drain regions, each of the first buffer layer and the second buffer layer comprises portions respectively facing the plurality of nanosheets in the first lateral direction.

18. The integrated circuit device of claim 15, wherein, in each of the pair of source/drain regions, the first buffer layer is in contact with each of the plurality of nanosheets, and the second buffer layer is in contact with only an uppermost nanosheet, which is farthest from the substrate from among the plurality of nanosheets, and the uppermost nanosheet comprises a contact portion in contact with the second buffer layer, and a vertical distance between the contact portion of the uppermost nanosheet and an uppermost surface of the uppermost nanosheet is less than a vertical distance between the contact portion and a lowermost surface of the uppermost nanosheet.

19. An integrated circuit device comprising:
a fin-type active region extending along a first lateral direction on a substrate;
a nanosheet stack comprising a plurality of nanosheets, the plurality of nanosheets being apart from a fin top surface of the fin-type active region at different vertical distances and facing the fin top surface of the fin-type active region in a vertical direction;
a gate line surrounding the plurality of nanosheets on the fin-type active region, the gate line extending along a second lateral direction, wherein the second lateral direction is perpendicular to the first lateral direction; and
a source/drain region on one side of the gate line on the fin-type active region, the source/drain region being in contact with the plurality of nanosheets,
wherein the source/drain region comprises a first buffer layer, a second buffer layer, and a main body layer, which are sequentially stacked in a direction away from the fin-type active region, wherein each of the first buffer layer, the second buffer layer, and the main body layer comprises a $Si_{1-x}Ge_x$ layer doped with boron (B) and have gradually increased Ge concentrations and gradually increased concentrations of boron in a direction away from the fin-type active region in the vertical direction, wherein x is greater than 0,
the second buffer layer is between the first buffer layer and the main body layer to conformally cover a surface of the first buffer layer, which covers the main body layer, and the second buffer layer comprises a side buffer portion facing the plurality of nanosheets and a bottom buffer portion facing the fin-type active region, and a ratio of a thickness of the side buffer portion to a thickness of the bottom buffer portion is in a range of about 0.9 to about 1.1.

20. The integrated circuit device of claim 19, wherein, in the source/drain region, each of the first buffer layer and the second buffer layer comprises portions respectively facing the plurality of nanosheets in the first lateral direction, in the source/drain region, the first buffer layer is in contact with each of the plurality of nanosheets, and the second buffer layer is in contact with an uppermost nanosheet, which is farthest from the substrate from among the plurality of nanosheets, and the uppermost nanosheet comprises a contact portion in contact with the second buffer layer, and a vertical distance between the contact portion of the uppermost nanosheet and an uppermost surface of the uppermost nanosheet is less than a vertical distance between the contact portion and a lowermost surface of the uppermost nanosheet.

21. The integrated circuit device of claim 19, wherein the concentration of boron in the first buffer layer is about 2E18 atoms/cm$^3$ or higher and about 7E18 atoms/cm$^3$ or lower, the concentration of boron in the second buffer layer is about 1E20 atoms/cm$^3$ or higher and less than about 5E20 atoms/cm$^3$, and the concentration of boron in the main body layer is about 5E20 atoms/cm$^3$ or higher and about 7E20 atoms/cm$^3$ or lower.

22. The integrated circuit device of claim 19, wherein the at least one of the source and the drain region comprises the source region and the drain region.

* * * * *